(12) United States Patent
Bounakoff et al.

(10) Patent No.: US 12,429,971 B2
(45) Date of Patent: Sep. 30, 2025

(54) SOFT PHASIC ELECTRONIC TACTILE SENSING ELEMENTS FOR CHARACTERIZATION OF TOUCH

(71) Applicant: SOCPRA SCIENCES ET GÉNIE S.E.C., Sherbrooke (CA)

(72) Inventors: Cyril Bounakoff, Albiez-Montrond (FR); Jacques Beauvais, Gatineau (CA); François Michaud, Sherbrooke (CA); Jonathan Genest, Sherbrooke (CA)

(*) Notice: Subject to any disclaimer, the term of this patent is extended or adjusted under 35 U.S.C. 154(b) by 0 days.

(21) Appl. No.: 18/843,462

(22) PCT Filed: Mar. 6, 2023

(86) PCT No.: PCT/CA2023/050291
§ 371 (c)(1),
(2) Date: Sep. 3, 2024

(87) PCT Pub. No.: WO2023/164784
PCT Pub. Date: Sep. 7, 2023

(65) Prior Publication Data
US 2025/0190066 A1    Jun. 12, 2025

Related U.S. Application Data

(60) Provisional application No. 63/316,679, filed on Mar. 4, 2022.

(51) Int. Cl.
G06F 3/041    (2006.01)
G06F 3/045    (2006.01)
G06F 3/047    (2006.01)

(52) U.S. Cl.
CPC .......... G06F 3/04146 (2019.05); G06F 3/045 (2013.01); G06F 3/047 (2013.01)

(58) Field of Classification Search
CPC ....... G06F 3/04146; G06F 3/045; G06F 3/047
USPC .................................................. 345/173, 174
See application file for complete search history.

(56) References Cited

U.S. PATENT DOCUMENTS

| | | | |
|---|---|---|---|
| 4,715,235 A | 12/1987 | Fukui et al. | |
| 8,250,927 B2 | 8/2012 | Anand et al. | |
| 9,421,087 B1 | 8/2016 | Hekmatshoartabari et al. | |
| 9,869,596 B2 * | 1/2018 | Ghatak | G01L 1/247 |
| 2006/0010996 A1 * | 1/2006 | Jordan | G01M 5/0041 73/774 |

(Continued)

OTHER PUBLICATIONS

International application No. PCT/CA2023/050291 International Search Report dated May 31, 2023.

(Continued)

*Primary Examiner* — Jimmy H Nguyen
(74) *Attorney, Agent, or Firm* — Anglehart et al.

(57) ABSTRACT

Described herein is an apparatus and method for detecting various types of contacts, touches and complex gestures as well as allowing for their detailed and accurate characterization. In one aspect, the apparatus is an intrinsically phasic artificial mechanoreceptor. The proposed apparatus can provide biomimetic artificial skins with sensitivity to changes rather than static stimulation. It is shown that the representations of spatiotemporal mechanical signals that can be efficiently classified into various types of complex touches (gestures: stroke, scratch, slap, pinch, etc.).

20 Claims, 27 Drawing Sheets

(56) References Cited

U.S. PATENT DOCUMENTS

| | | | | |
|---|---|---|---|---|
| 2011/0226066 | A1* | 9/2011 | Anand | G01B 7/18 |
| | | | | 252/502 |
| 2011/0273394 | A1* | 11/2011 | Young | G06F 3/04146 |
| | | | | 427/126.3 |
| 2015/0250420 | A1* | 9/2015 | Longinotti-Buitoni | ..................... |
| | | | | A61B 5/1135 |
| | | | | 600/534 |

OTHER PUBLICATIONS

International application No. PCT/CA2023/050291 Search Strategy dated May 31, 2023.

International application No. PCT/CA2023/050291 Written Opinion of the International Searching Authority dated May 31, 2023.

International application No. PCT/CA2023/050291 Supplementary International Search Report dated Jun. 3, 2024.

Burgess et al. The neural signal for skin indentation depth. I. Changing indentations. Journal of Neuroscience Aug. 1, 1983, 3 (8) 1572-1585; https://doi.org/10.1523/JNEUROSCI.03-08-01572.1983.

Hayward et al. Spatio-temporal skin strain distributions evoke low variability spike responses in cuneate neurons. Journal of the Royal Society Interface. Published Apr. 6, 2014. (DOI: 10.1098/rsif.2013.1015).

Genest et al. Directly grown large area single-walled carbon nanotube films with very high sensitivity to normal pressure. Journal of. Applied Physics. 111, 023502 (2012) (DOI: 10.1063/1.3676580).

Guo et al. All-Soft Skin-Like Structures for Robotic Locomotion and Transportation. Soft Robotics. vol. 7, No. 3. Published Online: Jun. 2, 2022. (DOI: 10.1089/soro.2019.0059).

Kim et al., A bioinspired flexible organic artificial afferent nerve. Science. Jun. 1, 2018. vol. 360, Issue 6392. pp. 998-1003. DOI: 10.1126/science.aao0098.

Wu et al., Taxel-addressable matrix of vertical-nanowire piezotronic transistors for active and adaptive tactile imaging. Science. May 24, 2013;340(6135):952-7. doi: 10.1126/science.1234855. Epub Apr. 25, 2013.

Boutry et al., A hierarchically patterned, bioinspired e-skin able to detect the direction of applied pressure for robotics. Science Robotics. Nov. 21, 2018. vol. 3, Issue 24. DOI: 10.1126/scirobotics.aau6914.

Cohen et al., A Highly Elastic, Capacitive Strain Gauge Based on Percolating Nanotube Networks. Nano Lett. Mar. 12, 2012, 12, 4, 1821-1825. (DOI: 10.1021/nl204052z).

S. Khan et al., Technologies for Printing Sensors and Electronics Over Large Flexible Substrates: A Review. IEEE Sensors Journal. vol. 15, Issue: 6, Jun. 2015. pp. 3164-3185. Date of Publication: Dec. 4, 2014 DOI: 10.1109/JSEN.2014.2375203.

Nolano et al. Quantification of myelinated endings and mechanoreceptors in human digital skin. Annuals of Neurology. vol. 54, Issue2. Aug. 2003. pp. 197-205 (DOI: 10.1002/ana. 10615).

Knibeström, Stimulus—response functions of rapidly adapting mechanoreceptors in the human glabrous skin area. The Journal of Physiology. vol. 232, Issue3. Aug. 1, 1973. pp. 427-452 (DOI: 10.1113/jphysiol. 1973.sp010279.

Iggo et al., Correlative physiological and morphological studies of rapidly adapting mechanoreceptors in cat's glabrous skin. (DOI: 10.1113/jphysiol.1977.sp011768.

Hammock et al. 25th Anniversary Article: The Evolution of Electronic Skin (E-Skin): A Brief History, Design Considerations, and Recent Progress. Advanced Materials. vol. 25, Issue42. Nov. 13, 2013. pp. 5997-6038. (DOI: 10.1002/adma.201302240).

Lipomi et al. Skin-like pressure and strain sensors based on transparent elastic films of carbon nanotubes. Nature Nanotechnology. vol. 6, pp. 788-792 (2011). Published: Oct. 23, 2011. (DOI: 10.1038/nnano.2011.184).

Maiolino et al., A Flexible and Robust Large Scale Capacitive Tactile System for Robots. Journals & Magazines. IEEE Sensors Journal. vol. 13 Issue: 10. pp. 3910-3917. Date of Publication: Apr. 15, 2013. (DOI: 10.1109/jsen.2013.2258149).

Mazzei et al., Touch sensor for social robots and interactive objects affective interaction. Sensors and Actuators A: Physical. vol. 251, Nov. 1, 2016, pp. 92-99. (DOI: 10.1016/j.sna.2016.10.006).

Bounakoff et al., Compliant Interface Based on Carbon Nanotube Piezoresistive Films for Social Interaction. Conference: Extended Abstracts of the 2018 CHI Conference. Apr. 2018. DOI: 10.1145/3170427.3188690.

Hayes et al., A mathematical analysis for indentation tests of articular cartilage. Journal of Biomechanics vol. 5, Issue 5. Sep. 1972, pp. 541-551. (DOI: 10.1016/0021-9290(72)90010-3).

Zhang et al., Time dependence of piezoresistance for the conductor-filled polymer composites. Journal of Polymer Science Part B: Polymer PhysicsVolume. vol. 38, Issue21. Nov. 1, 2000. pp. 2739-2749. (DOI: 10.1002/1099-0488(20001101).

Kang et al. Piezoresistive characteristics of single wall carbon nanotube/polyimide nanocomposites. Journal of Polymer Science, Part B, Polymer Physics. vol. 47, Issue10. May 15, 2009. pp. 994-1003 (DOI: 10.1002/polb.21705).

Morteza Amjadi et al., Ultra-stretchable and skin-mountable strain sensors using carbon nanotubes—Ecoflex nanocomposites. Nanotechnology, vol. 26, No. 37. DOI 10.1088/0957-4484/26/37/375501.

Morteza Vatani et al., Detection of the position, direction and speed of sliding contact with a multi-layer compliant tactile sensor fabricated using direct-print technology. Smart Materials and Structures, vol. 23, No. 9. DOI 10.1088/0964-1726/23/9/095008.

D. D. L. Chung, A critical review of piezoresistivity and its application in electrical-resistance-based strain sensing. Journal of Materials Science. Aug. 10, 2020. vol. 55, pp. 15367-15396, (2020).

* cited by examiner

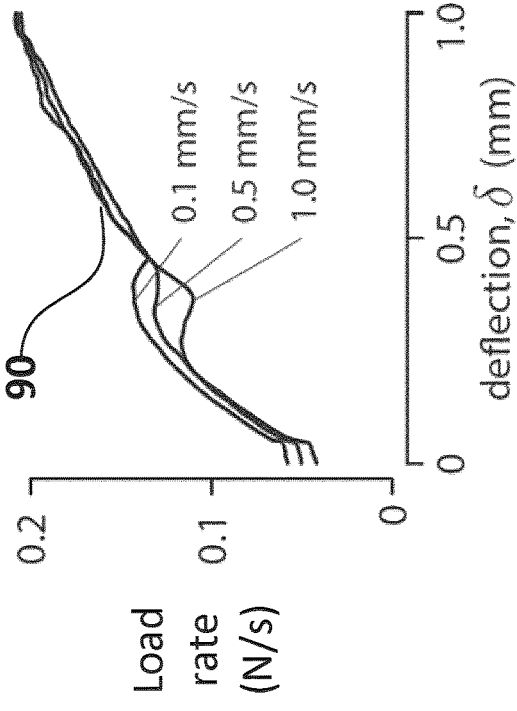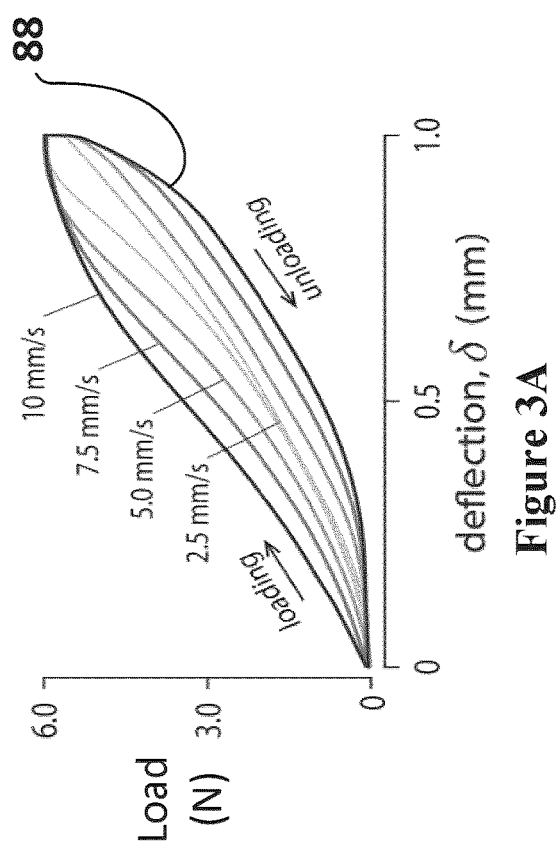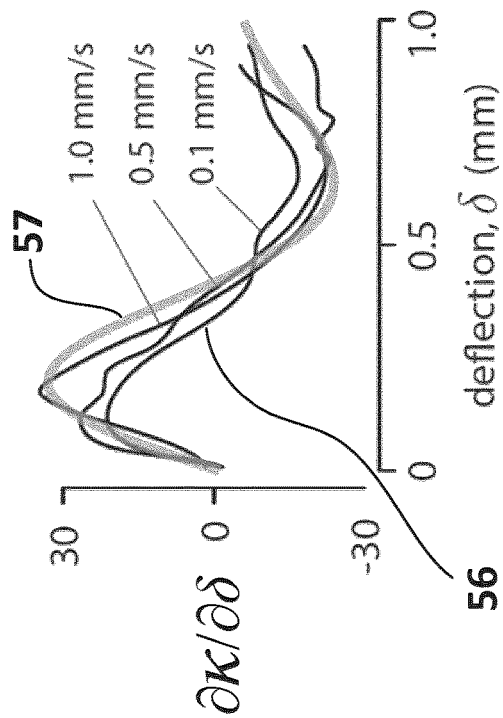
Figure 3A
Figure 3B
Figure 3C
Figure 3D

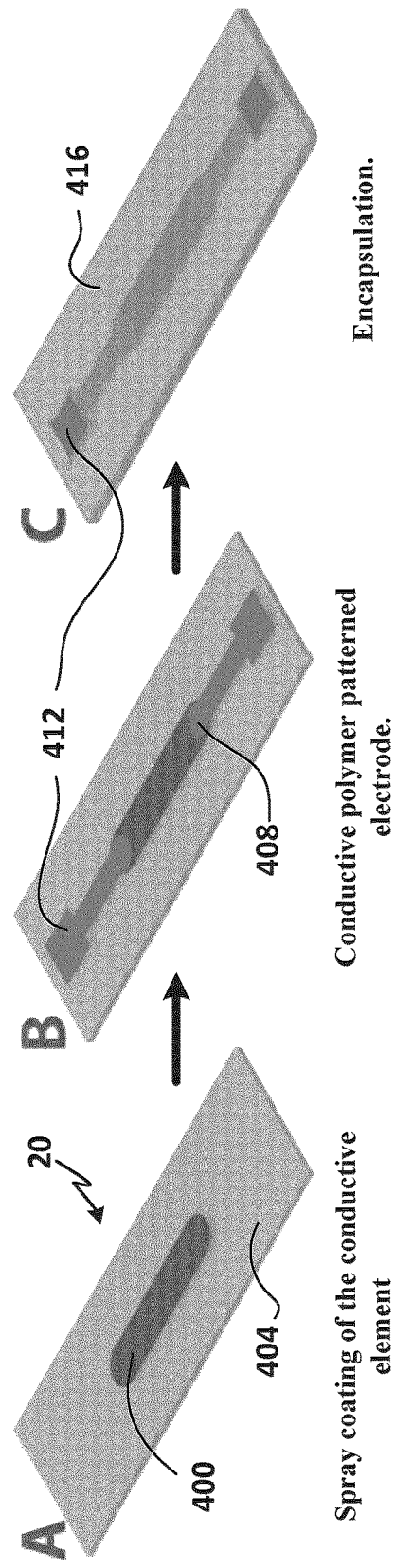
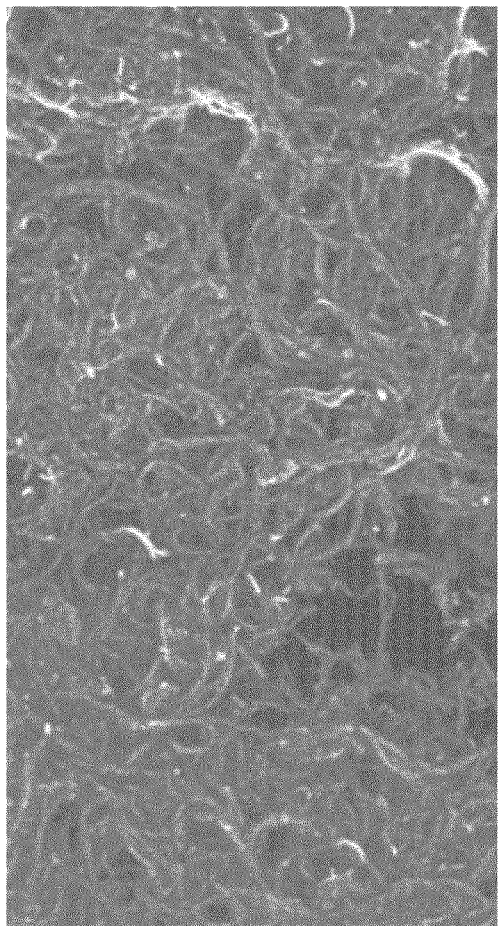
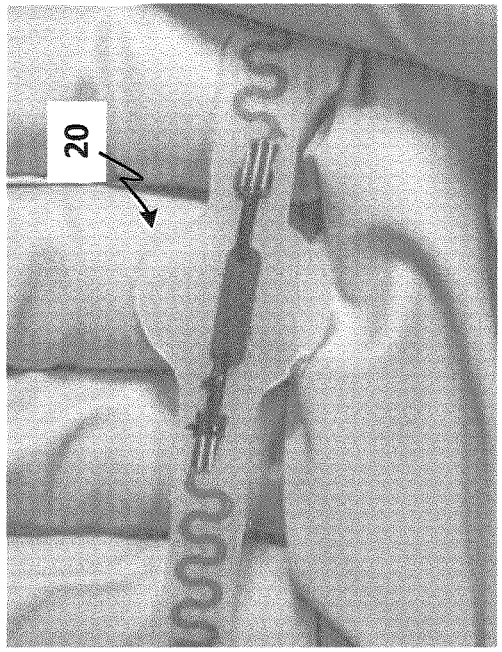
Figure 7A
Figure 7B
Figure 7C

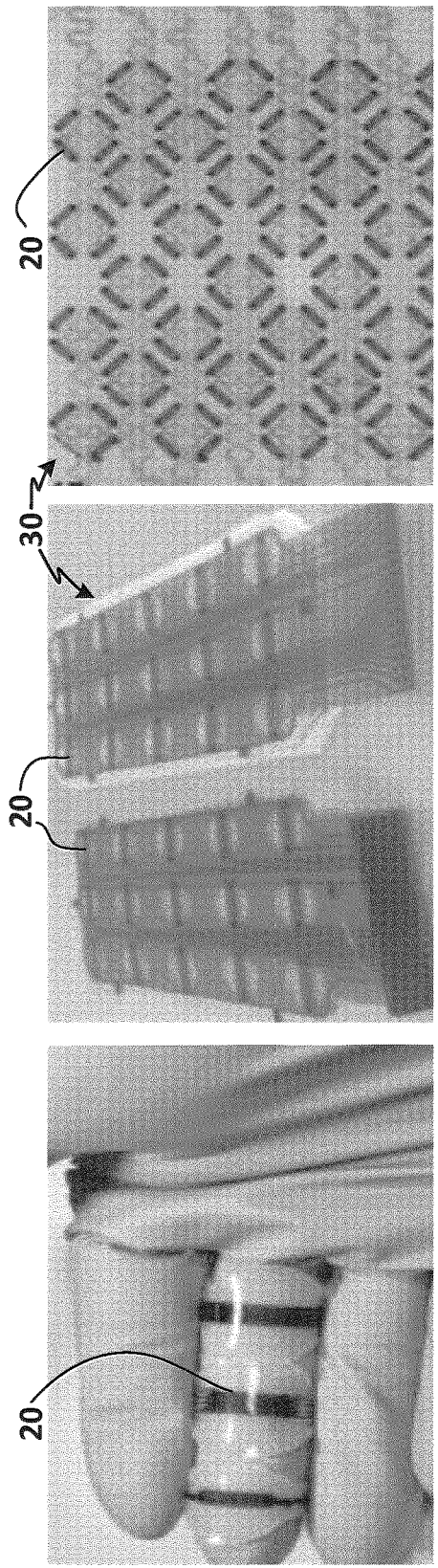
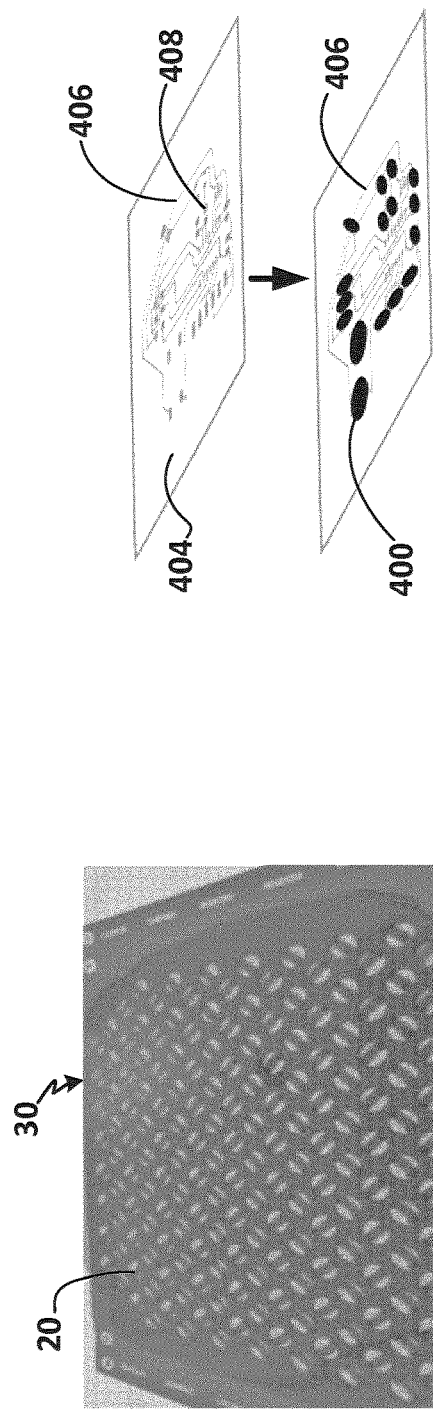
Figure 12A
Figure 12B
Figure 12C
Figure 12D
Figure 12E

SOFT PHASIC ELECTRONIC TACTILE SENSING ELEMENTS FOR CHARACTERIZATION OF TOUCH

CROSS-REFERENCES TO OTHER RELATED PATENT APPLICATIONS

This application claims priority from U.S. provisional patent application 63/316,679 filed Mar. 4, 2022, the content of which is hereby incorporated by reference.

TECHNICAL FIELD

The present disclosure relates to the field of sensing devices. More specifically, the present disclosure relates to an electronic tactile sensing element comprising a network of piezoresistive particles for generating a phasic signal.

BACKGROUND

In the human fingertip, it is observed that about 80% of the shallow mechanoreceptors of the glabrous human skin exhibit phasic properties and the density of phasic receptors is five times greater than that of tonic receptors as indicated by Nolano et al. (DOI: 10.1002/ana.10615). A hallmark of phasic sensory neurons is to respond preferentially at the onset and at the termination of a stimulus by contrast with tonic sensory neurons that respond throughout the imposition of a stimulus.

The need to provide biomimetic artificial skins with sensitivity to changes rather than static stimulation has been recognized since the 1970s, therefore many previous works studied the response of the human skin to touch and successfully modeled various relationships between its response and some aspects of the touch. Knibestol (DOI: 10.1113/jphysiol.1973.sp010279), found a diversity of responses to indentation rates in fast-adapting mechanoreceptors in human skin, with thresholds distributed over a hundredfold span that he correlated with a three-parameter sigmoidal-log model that accounted for the individual responses of twenty units. Iggo and Ogawa (DOI: 10.1113/jphysiol.1977.sp011768), when studying response to magnitude of indentation from a rate of indentation, found a significant relationship between the rate of discharge and the rate of indentation and a weak relationship with magnitude. Burgess et al. (DOI: 10.1523/jneurosci.03-08-01572.1983) also found a relationship between indentation rate and receptor response. Hayward et al. (DOI: 10.1098/rsif.2013.1015) investigated the dependency of the neuronal response on the temporal rate of mechanical stimuli in second-order cells and concluded that certain types of stimuli elicited responses that were strongly dependent on stimulus variations due to movement and therefore depend on phasic sensing.

Receptors that exhibit phasic responses are termed adaptive because adaptation relates to a modification of the encoding of a stimulus, according to its statistics. Hammock et al. (DOI: 10.1002/adma.201302240) summarized the evolution of e-skin which indicates that the physics commonly harnessed to realize artificial tactile sensors include piezoresistivity, capacitance, piezoelectricity, light transmission and reflection. Piezoresistive sensors alter an electric current, according to the strain to which a conductive element is exposed. Piezoresistivity characteristic of carbon nanotube films in response to various parameters (e.g., tensile and compressive loads) were studied by Kang et al. (DOI: 10.1002/polb.21705) and Genest et al. (DOI: 10.1063/1.3676580). Piezoelectric sensors in particular acquire high-pass characteristics when connected to low electrical impedances. The dynamic properties of these sensors are obtained by the readout circuitry, not by the transduction process.

The implementation of e-skins may be required to comply with many requirements. Some of the recent trends in sensor technology have been driven by soft robotics as presented by Guo et al. (DOI: 10.1089/soro.2019.0059) which made all-soft skin-like structures for robotic locomotion and transportation. Kim et al. (DOI: 10.1126/science.aao0098) made a bioinspired flexible organic artificial afferent nerve. Lipomi et al. (DOI: 10.1038/nnano.2011.184) made a skin-like pressure and strain sensors based on transparent elastic films of carbon nanotubes. Maiolino et al. (DOI: 10.1109/jsen.2013.2258149) made a whole robot-body sensor using an array of capacitive sensors made from a thin layer of conductive fabric demonstrated sufficient stability for human interaction. Mazzei et al. (DOI: 10.1016/j.sna.2016.10.006) made a flexible piezoresistive e-skin enabled a neural net classifier to identify different types of caress-like stimuli. Wu et al. (DOI: 10.1126/science.1234855) made a taxel-addressable matrix of vertical-nanowire piezotronic transistors for active and adaptive tactile imaging. Kim et al. (DOI: 10.1038/srep12705) made a sensor array using multi-functional field-effect transistors with ultrahigh sensitivity and precision for bio-monitoring. Boutry et al. (DOI: 10.1126/scirobotics.aau6914) made a hierarchically patterned, bioinspired e-skin able to detect the direction of applied pressure for robotics. Recent designs continue to attribute great importance to phasic sensing in robot proprioception. Cohen et al. (DOI: 10.1021/n1204052z) made a highly elastic, capacitive strain gauge based on percolating nanotube networks. While intrinsically phasic artificial mechano-sensors have been described, for example by Bounakoff et al. (DOI: 10.1145/3170427.3188690) that showed that an e-skin based on piezoresistive carbon nanotube (CNT) films may have various responses to contact. However, the phasic response to touch of an intrinsically phasic e-skins have not yet been used to characterize a touch based on the associated phasic response/signal of the e-skin.

SUMMARY

The present specifications discuss a mechano-sensing cell that can exhibit an intrinsic phasic response without resorting to electronic circuitry.

A touch-sensitive device comprising at least one loosely connected three-dimensional network of conductive particles embedded in a viscoelastic layer, where a portion of the network have an initial local resistivity. When the portion of the network undergoes a local stretch resulting from a partial deflection of the network resulting from a partial compression of the touch-sensitive device, it has a second local resistivity higher than the initial local resistivity resulting from decreased connection between local conductive particles being brought apart from one another. Wherein the decreased connection can result from a decrease of paths allowing for electrical percolation, which can result from an increase distance between the conductive particles. When the portion of the network undergoes a local compression resulting from a further deflection of the network resulting from a further compression of the touch-sensitive device, it has a third local resistivity lower than said second local resistivity resulting from increased connection between said local conductive particles being brought closer to one another. Wherein the increased connection can result from an increase of paths allowing for electrical percolation, which can result from a decrease distance between the conductive particles. A local resistivity of the portion of the network undergoes both an increase and a decrease during each of contact establishment and contact release of the touch-sensitive device having a phasic response to contact, wherein a rate of at least one of the increase and the decrease of the local resistivity as a function of time is used to characterize at least a rate of deflection and/or a magnitude of deflection of said contact.

In some embodiments, the rate of both said increase and said decrease of said local resistivity as a function of time are used to characterize said rate of deflection of said contact.

In some embodiments, the amplitude of a change of said local resistivity as a function of time is used to characterize said magnitude of deflection.

In some embodiments, both the increase and the decrease of the local resistivity as a function of time are used to characterize the rate of deflection and/or the magnitude of deflection.

In some embodiments, the rate of deflection and/or the magnitude of deflection are used to determine a type of touch of the contact.

In some embodiments, the at least one loosely connected three-dimensional network is positioned between a bottom portion and a top portion of the viscoelastic layer.

In some embodiments, the touch-sensitive device comprises at least one input electrode and at least one output electrode connected to the network, where the output electrode is used to transmit the phasic response to contact.

In some embodiments, further comprising a resistivity detection circuitry at least connected to the least one output electrode to detect the increase and the decrease of the local resistivity of the portion of the at least one loosely connected three-dimensional network.

In some embodiments, the conductive particles are elongated conductive particles.

In some embodiments, the elongated conductive particles are carbon nanotubes.

In some embodiments, the viscoelastic layer is an elastomeric layer.

In some embodiments, the at least one input electrode is connected to the at least one loosely connected three-dimensional network by means of a first intermediate connection, and wherein the at least one output electrode is connected to the at least one loosely connected three-dimensional network by means of a second intermediate connection.

In some embodiments, the first intermediate connection and the second intermediate connection comprise at one conductive polymer.

In some embodiments, a plurality of the at least one loosely connected three-dimensional network is arranged in an array embedded in the viscoelastic layer.

In some embodiments, the touch-sensitive device comprising a plurality of the array, wherein each one of the plurality of the arrays are electrically isolated from one another and stacked on top of each other.

In some embodiments, the at least one loosely connected three-dimensional network is a strip extending from near a first side of the viscoelastic layer to near one opposed side of the first side of the viscoelastic layer.

In some embodiments, the array is a two-dimensional array of a plurality of the strip parallel to one another; wherein a plurality of the two-dimensional array are electrically isolated from one another and parallelly stacked on top of each other; wherein the plurality of the strip parallel to one another of at least one of the plurality of the two-dimensional array have a direction different from a direction of the plurality of the strip parallel to one another of the at least one other of the plurality of the two-dimensional array; and wherein at least one signal of the at least one of the plurality of the two-dimensional array and at least one signal of the at least one other of the plurality of the two-dimensional array are used to extrapolate a two-dimensional position of the contact.

In some embodiments, the direction of the plurality of the strip parallel to one another of at least one of the plurality of the two-dimensional array is used to determine a one-dimensional position of the two-dimensional position of the contact, and is perpendicular to the direction of the plurality of the strip parallel to one another of the at least one other of the plurality of the two-dimensional array; and wherein the direction of the plurality of the strip parallel to one another of the at least one other of the plurality of the two-dimensional array is used to determine another one-dimensional position of the two-dimensional position of the contact.

In some embodiments, at least a portion of a bottom surface of the viscoelastic layer is coupled to an upper surface of a support layer, wherein the support layer being more rigid than the viscoelastic layer.

In some embodiments, the upper surface of the support layer is textured.

In some embodiments, a portion of a top surface of the viscoelastic layer is textured.

In some embodiments, the at least one input electrode connected to a first end of the at least one loosely connected three-dimensional network and the at least one output electrode connected to a second end of the at least one loosely connected three-dimensional network opposed to the first end.

In some embodiments, the touch-sensitive device comprising a plurality of the at least one input electrode and a plurality of the at least one output electrode arranged in an array of electrodes connected to the at least one loosely connected three-dimensional network.

In some embodiments, at least one of the plurality of the at least one input electrode and at least one of the plurality of the at least one output electrode are selected as the only electrodes used to measure the local resistivity of the portion of the at least one loosely connected three-dimensional network.

In some embodiments, the touch-sensitive device is prepared by selecting the conductive particles; dispersing the conductive particles within the viscoelastic layer with a selected dispersion between the conductive particles to produce the at least one loosely connected three-dimensional network of conductive particles embedded in the viscoelastic layer.

In some embodiments, the viscoelastic layer comprising a viscoelastic support layer and a viscoelastic encapsulating layer; and wherein the dispersing comprising: preparing a conductive particle solution by mixing the conductive particles in a fluid; applying at least one layer of the conductive particle solution on a surface of the viscoelastic support layer; drying the layer of the conductive particle solution to leave at least one loosely connected three-dimensional network of the plurality of conductive particles respecting the selected dispersion between the conductive particles; and covering the loosely connected three-dimensional network of the conductive particles with the viscoelastic encapsulating layer.

In some embodiments, the preparing the conductive particle solution further comprising mixing a surfactant in the conductive particle solution.

In some embodiments, the applying comprising spraying the conductive particle solution on the surface of the viscoelastic support layer to make the layer of the conductive particle solution.

In some embodiments, a plurality of the rate of increase and/or of decrease of the plurality of the three-dimensional network is used for classifying gestures.

The Applicant further proposes a method for detecting touch comprising: a) providing a touch-sensitive device as previously defined; b) subjecting the touch-sensitive device to a touch action inducing the contact; c) measuring the local resistivity of the portion of the at least one loosely connected three-dimensional network; d) detecting an increase and/or a decrease of the local resistivity of the portion of the at least one loosely connected three-dimensional network; and e) characterizing a rate of deflection and/or a deflection magnitude of the touch action using a rate of at least one of the increase and/or the decrease of the local resistivity as a function of time of the portion.

In some embodiments, the characterizing further comprises identifying any establishing of the touch action and any releasing of the touch action using the increase and the decrease of the local resistivity as a function of time.

In some embodiments, the characterizing further comprises characterizing a magnitude of a deflection of the touch-sensitive device induced by the touch action with an amplitude of the increase and the decrease of the local resistivity as a function of time.

In some embodiments, the characterizing further comprises determining the rate of deflection of the touch with an amplitude of the increase and the decrease of the local resistivity as a function of the magnitude of the deflection of the touch-sensitive device induced by the touch.

The Applicant further proposes a method for characterizing touch comprising: a) providing a touch-sensitive device comprising at least one loosely connected three-dimensional network that undergoes both an increase and a decrease of a local resistivity of the network when subjected to touch; b) subjecting the touch-sensitive device to a touch; c) measuring the local resistivity of the at least one loosely connected three-dimensional network; d) detecting an increase and/or a decrease of the local resistivity as a function of time of the at least one loosely connected three-dimensional network; and e) characterizing the touch using a rate of the increase and/or the decrease of the local resistivity as a function of time of the portion.

In some embodiments, the characterizing step comprises classifying type of touches.

In some embodiments, the classifying type of touches comprises classifying gestures.

BRIEF DESCRIPTION OF THE DRAWINGS

The invention will be better understood by way of the following detailed description of embodiments of the invention with reference to the appended drawings, in which:

FIG. 3A shows curves of the rate dependent hysteresis, the load as a function of deflection, for large displacements.

FIG. 3B shows curves of the non-monotonic relationship between load rate and deflection for large displacements.

FIG. 3C shows curves of the relationship between the variation of resistance and deflection with a gray approximation line of the prediction of a model, for large displacements.

FIG. 3D shows curves of the relationship between the rate of change of resistance and the deflection with a gray line of the prediction of a model, for large displacements.

FIG. 7A shows some of the main steps of the manufacturing of a PHAST.

FIG. 7B shows an exemplary embodiment of a PHAST.

FIG. 7C shows a microscope image of a layer of an exemplary touch-sensitive element of an embodiment of a PHAST comprising a film of spray coated carbon nanotubes.

FIG. 12A shows three embodiments of individual PHASTs.

FIG. 12B show an embodiment of an e-skin that comprises an array of 15 PHAST units (70 mm×100 mm each).

FIG. 12C shows an embodiment of an e-skin that comprises an array of 160-PHAST stretchable e-skin with 160 PHAST units (200 mm×200 mm each).

FIG. 12D shows an embodiment of an e-skin that comprises an array of 191-PHAST units (200 mm×230 mm each).

FIG. 12E illustrates an embodiment of an e-skin comprising an array of various PHASTs that are arranged as required on a circuitry pre-applied on the substrate.

DETAILED DESCRIPTION

Figure 1:
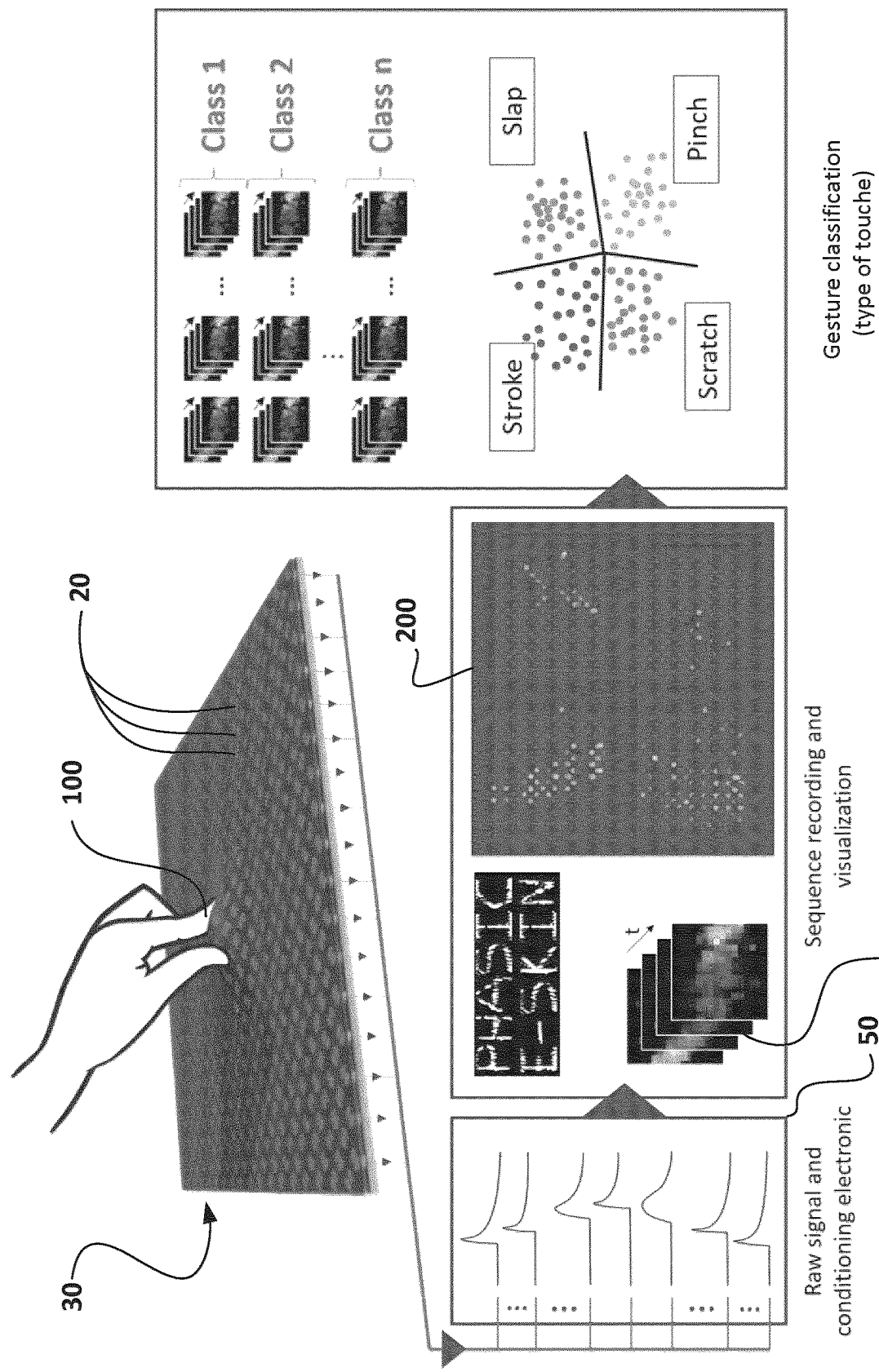
FIG. 1 shows an embodiment where an exemplary e-skin, comprising a plurality of PHASTs, subjected to various touches is producing various phasic signals that can be interpreted and classified to identify the nature of the corresponding touch.

In this patent, the term "touch" is understood to mean any type of physical contact with the touch-sensitive device, which can induce physical pressure on the device that may result in any type of deformation of the device, including any deflection, indentation, flexing, shear or more. A touch as defined herein can include pushing, pulling, stroking, slapping, pinching, rubbing, scratching, squishing, or other type of physical contact or social touch gestures with the device.

The following is a detailed description of some of the embodiments of the disclosure depicted in the accompanying drawings. The embodiments are in such detail as to clearly communicate the disclosure without limiting the anticipated variations of the possible embodiments and may encompass all modifications, equivalents, combinations and alternatives falling within the spirit and scope of the present disclosure. It will be appreciated by those skilled in the art that well-known methods, procedures, and components may not have been described in detail in the following so as not to obscure the specific details of the disclosed invention.

The present disclosure presents an e-skin technology that can support the recognition of a wide range of touches. A novel aspect of this technology is that the individual sensing units spontaneously exhibit phasic responses akin to the responses observed in mammalian mechanoreceptors.

The proposed apparatus can be used for detecting various types of touches (e.g., contacts and complex gestures) as well as allowing for their detailed and accurate characterization/classification. The apparatus can be an intrinsically phasic artificial mechanoreceptor. The proposed apparatus can provide biomimetic artificial skins with sensitivity to changes rather than static stimulation.

Applicant as developed a phasic touch-sensitive device that can easily be mass-produced and/or made to be flexible, which can allow it to be mounted on various shapes and therefore be adapted for a wide range of applications. Such a phasic touch-sensitive device can have significant advantage of compressing sensory data by filtering out the less informative static components and, in some embodiments, can be directly coupled to biomimetic computational systems such as spiking networks. It will be appreciated that such a touch-sensitive device may be used in the context of the medical field (exoskeleton, prosthetics, etc.), robotic assistance, entertainment, industrial, intelligent environment or any other field of technology to identify or characterize a touch as previously described.

In some embodiments, the phasic touch-sensitive device can have a touch-sensitive element that can comprise conductive network models of loosely connected conductive particles having nonlinear contact mechanics that induces phasic property arising from a type of nonlinearity of its conductivity or resistivity, such as a loosely connected three-dimensional network of conductive particles. Conductive particles may include conductive nanoparticles and/or semiconductive particles. In some embodiments, conductive particles can have a shape that can be elongated, namely thin, filiform, stringy, tubular or a combination thereof. In some embodiments, the conductive particles can alternatively be or can further comprise conductive particles can have a spherical, ovoid, planar (flat), or other alternative shape. It will be appreciated that the conductive particles can have a wide variety of shapes and chemical functionalization, but it can be selected to increase the amplitude of the change of resistivity (e.g., spherical conductive particles can be less sensitive to touch than filiform conductive particles). In some embodiments, the conductive particles can be made of a single material or a combination of various materials that can include carbon, silicon, or any conductive or semiconductive materials. The phasic signal resulting from the interaction between the conductive network and some touches (e.g., pressures, rubbings, shear, twist and/or vibrations) may be characterized as a case of "natural computation", which may allow to detect transient mechanical stimuli that can encode most types of touches, such as the relevant behaviorally tactile information for example. Most embodiments of the phasic touch-sensitive device disclosed herein can be used to identify the touch/contact type [namely to identify the type of manipulation (e.g., the manipulated/touched object), the type of social touch referred herein as a social gesture or simply a gesture (pinching, stroking, caressing, scratching, kissing, pocking, etc.), the behaviorally tactile information and/or discriminating the touch] and some associated movement (e.g., tactile behavior such as the quality, stability and various properties of a gripping action for example) while significantly reducing and, in some embodiments, eliminating the need to process the raw signal that can be required for non-phasic taxels. Practical technologies based on such sensing mode are numerous in fields ranging from prosthetics, robotics, to wearables.

In the present disclosure such a touch-sensitive device (taxel) is referred to as a PHAST for Phasic Soft Taxel, where the term soft refers to the flexible qualities of the phasic taxel. Analogously to natural fast adapting afferents, in some embodiments, these elements can encode changes in mechanical stimulation and can remain silent during persisting stimulation, which may lead to parsimonious encoding and may facilitate the implementation of tactile inputs processing with machine learning algorithms, for example. In some embodiments, the PHAST comprises a three-dimensional network of loosely connected conductive particles embedded in an elastomeric matrix.

In some embodiments, although the PHAST of some embodiments can be made to be flexible, the PHAST could be further adapted to be partially flexible or comprise some rigid portions (e.g., a rigid layer supporting the flexible PHAST or a viscoelastic matrix supported by and coupled with a rigid substrate). The PHAST, as developed by the applicant, can present spontaneously and intrinsic phasic signals that may adapt over a one-second time scale for example, a duration which is compatible with social touch communication. In some embodiments, the sensor response can resemble the response of fast-adapting mammalian mechanoreceptors when stimulated by a spherical indenter. To interpret the various phasic signals that can be produced by the PHAST when subjected to a wide variety of touches (e.g., social touch gestures), it is possible to develop and use various signal analysis methods that can allow to output representations of spatiotemporal mechanical signals (resulting from touches).

FIG. 1 present an embodiment where an exemplary e-skin 30, comprising a plurality of PHASTs 20, subjected to various touches 100 is producing various phasic signals 50 that can be interpreted and classified to identify the nature of the corresponding touch 100. More specifically, FIG. 1 presents exemplary representations of spatiotemporal mechanical signals 200 resulting from interpreting spatiotemporal mechanical signals 111 which can be corresponding from the compilation of phasic signals 50 that can be measured with the exemplary embodiment of the e-skin 30 comprising a plurality/array of PHASTs 20 when subjected to touch 100.

FIG. 1 further illustrates that the representations of spatiotemporal mechanical signals 200 that can be efficiently classified into various types of touches (e.g., gestures: stroke, scratch, slap, pinch, etc.) and mechanical contacts with some embodiments of a signal analysis method.

Characterization of Phasic Signals

Figure 2A:
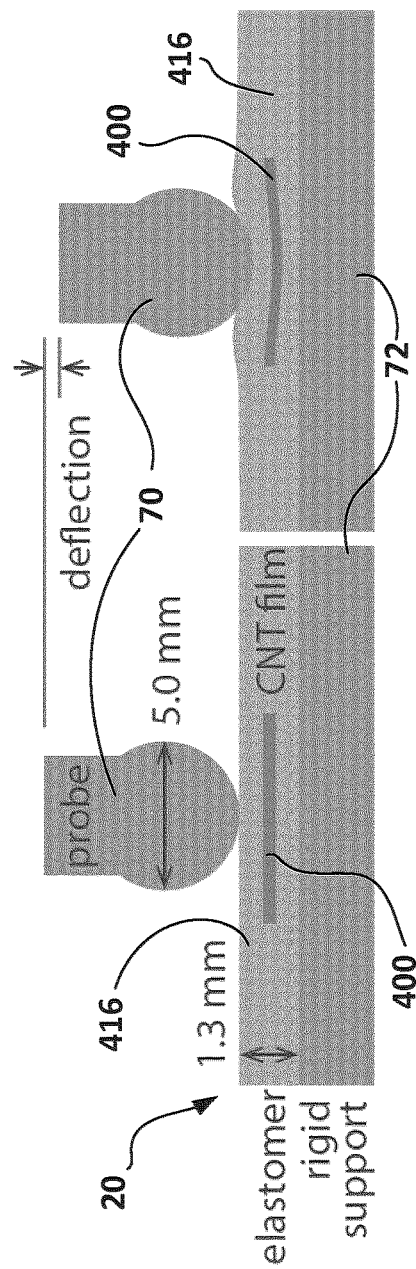
FIG. 2A is a schematic representation of a cross section of a side view of an exemplary setup of a universal testing method used to test tactile response.
Figure 2B:
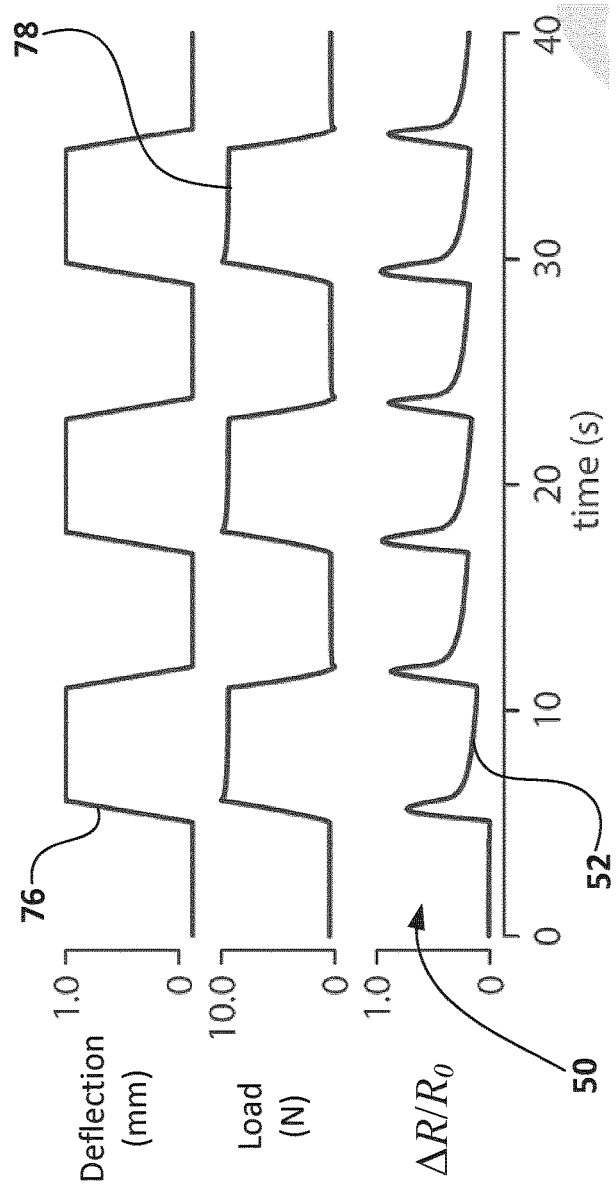
FIG. 2B shows the deflection and load of the probe over time that can be applied with the universal testing method depicted in FIG. 2A to allow a phasic response of the change of resistance of the tested phasic taxel.
Figure 2C:
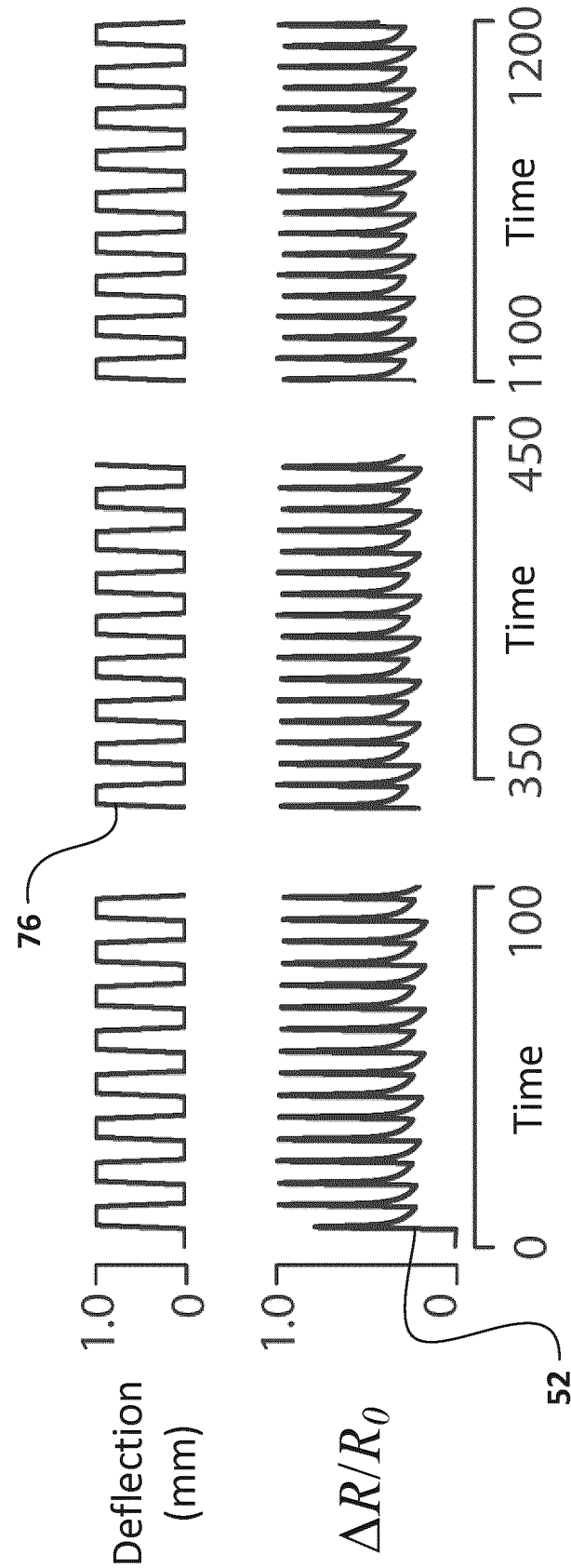
FIG. 2C shows the deflection of the probe over several hundreds of cycles that can be applied with the universal testing method depicted in FIG. 2A to allow a phasic response of the change of resistance of the tested phasic taxel.
Figure 2D:
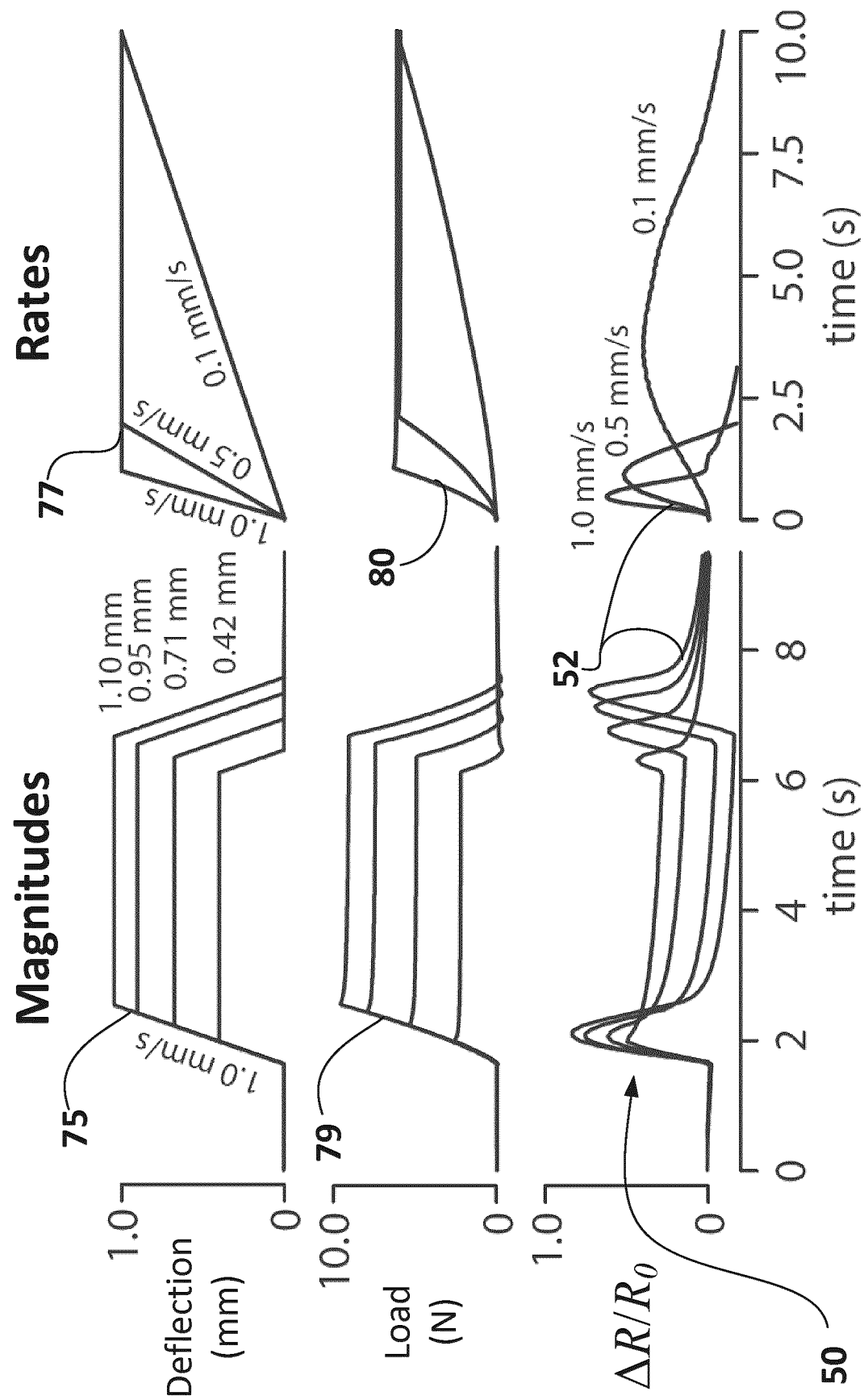
FIG. 2D shows the change of phasic response for various magnitudes and rates of both the deflection and load applied with the probe of the universal testing method depicted in FIG. 2A.

FIG. 2A present a schematic representation of an experimental setup where a PHAST 20, comprising a touch-sensitive element 400 and an encapsulation matrix 416, supported by a rigid support 72 is being compressed by a probe 70 simulating a compressing (pushing/poking) touch. This experimental setup corresponds to a universal testing method that can be used to apply sequences of indentations by a 5 mm spherical probe with a loading phase, a hold phase, and an unloading phase. FIG. 2B present an example of a deflection ($\delta$) 76 and load 78 sequence, here repeated for three cycles, of one embodiment of such universal testing method. FIG. 2B also shows a resulting phasic signal 50 that can be measured during both loading and unloading of the probe 70, which is corresponding to a change of resistance/resistivity ($\Delta R = R - R_0$) over the initial resistance/resistivity ($R_0$), which is referred to herein as the relative change of resistance/resistivity ($\Delta R/R_0$) 52, that can be produced with some embodiments of PHASTs 20. The measurements may indicate that the sensor responded mostly to changes in normal indentation with slow relaxation. The sensor cell (PHAST 20) can have a response bearing a surprising similarity with that of rapidly adaptive sensor cells. FIG. 2C shows the stability and reliability that some of the embodiments of a PHAST proposed herein can have over several hundreds of cycles. FIG. 2D shows that the phasic signal 50 (e.g., the rate of relative change of resistance/resistivity as a function of time: the rate of increase of the relative of resistance/resistivity as a function of time or the rate of decrease of the relative change of resistance/resistivity as a function of time, or a combination thereof) of a PHAST 20 can vary and can therefore reflect and can be used to characterize changes or values of deflection magnitude 75, rate of deflection 77, magnitude of a load 79 and/or rate of loading 80 associated to a touch/contact, which can be done using a similar universal testing method, the indentation can be varied for a same speed of indentation and the speed of indentation can be varied to reach the same indentation. The change of resistance during the loading and unloading phases was clearly a function of the final value of indentation while the change of resistance also depended on the rate of indentation.

It will be appreciated that, in some embodiments, the rate of deflection 77 can be determined/characterized using the shape of the change (e.g., rate of increase and/or the rate of decrease) of resistivity as a function of time of the touch-sensitive element 400 or of a local resistivity as a function of time of a portion of the touch-sensitive element 400 resulting from a touch/contact.

It will be appreciated that, in some embodiments, the magnitude of deflection 75 can be determined/characterized using the shape of the change (e.g., rate of increase and/or the rate of decrease) of resistivity as a function of time of the touch-sensitive element 400 or of a local resistivity as a function of time of a portion of the touch-sensitive element 400 resulting from a touch/contact.

It will be appreciated that, in some embodiments, both the rate of deflection 77 and the magnitude of deflection 75 can be determined/characterized using the shape of the change (e.g., rate of increase and/or the rate of decrease) of resistivity as a function of time of the touch-sensitive element 400 or of a local resistivity as a function of time of a portion of the touch-sensitive element 400 resulting from a touch/contact.

It will be appreciated that, when such characterizations are done using both the rate of increase and the rate of decrease, this can imply considering the combination of the two, which can be equivalent to using the full shape of the change of resistivity as a function of time.

In some embodiments, some aspects, namely the shape (e.g., the amplitude and the spread/rate/slope) of the phasic signal (relative change of resistance as a function of time) for example, may be used to characterize one or more aspects of the touch or touch action. In some embodiments, the amplitude of the relative change of resistance 52 as a function of time can be used to characterize the magnitude of a deflection since a change of deflection magnitude 75 can result in a change of magnitude (amplitude) of relative change of resistance 52 as a function of time as illustrated by results on the left part of FIG. 2D. In some embodiments, the amplitude and/or spread—rate—of the relative change of resistance 52 as a function of time can be used to characterize the rate of a deflection and/or a deflection magnitude since a change of deflection rate 77 can result in a change of magnitude (amplitude) and/or spread (e.g., width and slope), namely de rate, of relative change of resistance 52 (e.g., change of resistivity near the touch/contact—local resistivity) as illustrated by the results of the right part of FIG. 2D.

It will be appreciated that, although the exact physical mechanism implied in the phenomena at the origin of the phasic nature of the signal (non-linear change of resistivity) can't be explained with complete certainty, some hypothesizes suggest that various that there is a combination of two fast mechanisms (phase I and phase II) and another suggests that it is a competition between these fast mechanisms and slow mechanisms (phase III). The former is briefly explained in the following hypothesis.

Figure 2E:
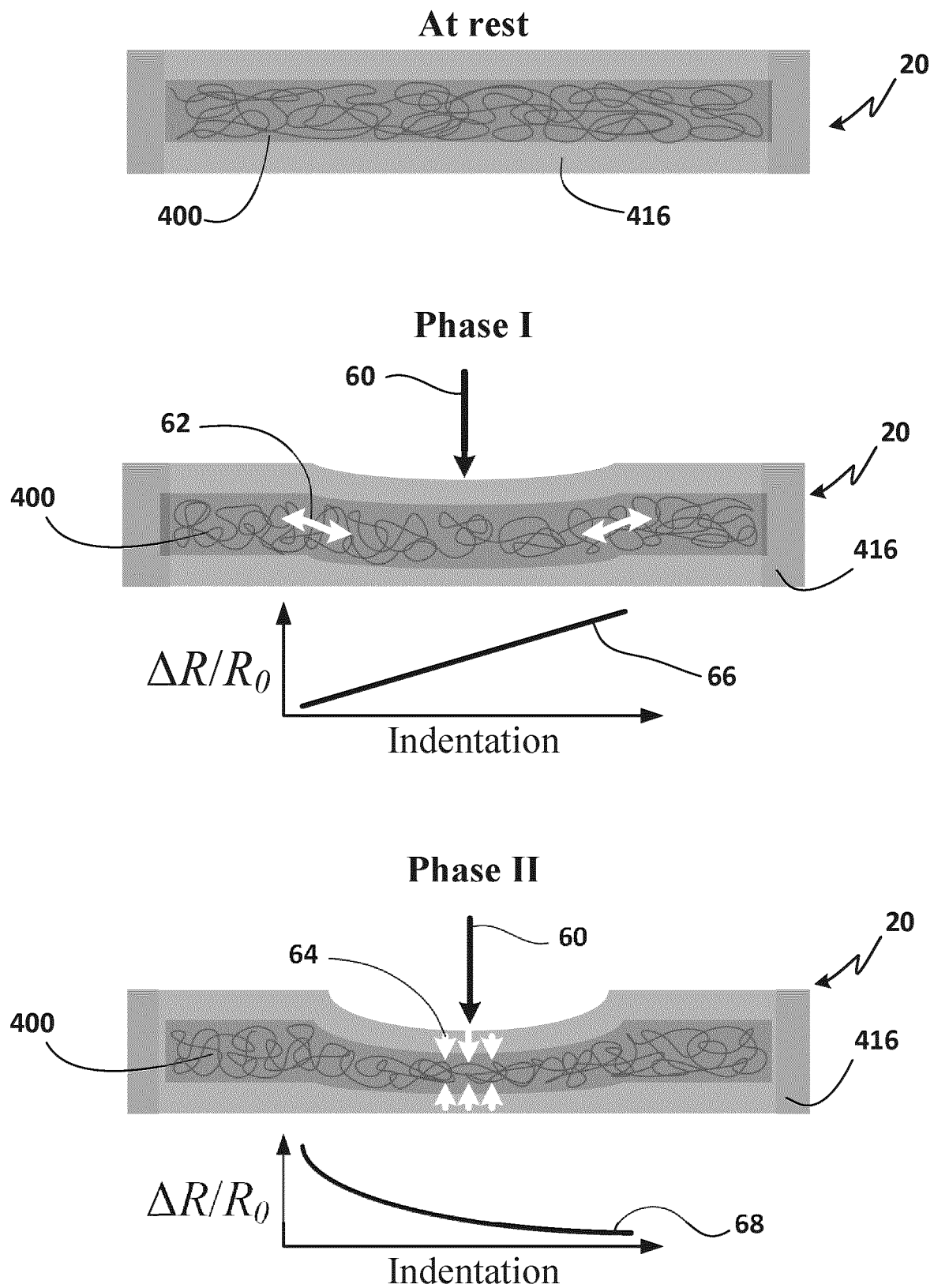
FIG. 2E shows a schematic representation of two of the main mechanical phenomena that can affect the resistivity of a touch-sensitive layer.

FIG. 2E presents a schematic representation of two of the main fast hypothetical mechanical phenomena (of the order of a few milliseconds to about a few seconds), here identified as a first phase I and phase II, that can affect the resistivity of a touch-sensitive element as illustrated by the curve of relative change of resistance as a function of deflection. A PHAST, initially at rest having an initial resistivity ($R_0$). Phase I of FIG. 2E illustrates a touch-sensitive element 400 undergoing a lateral stretching 62 when a PHAST undergoes a partial compression, which may be induced by a relatively small vertical indentation or deflection that can be the result of a compression force 60. A relatively small vertical indentation can deflect the matrix 416 and the touch-sensitive element 400 without significantly inducing compression of this last component. A lateral stretching 62 of a touch-sensitive element 400, can comprise a combination of both stretching and shear force, similar to the example illustrated in phase I of FIG. 2E, and can induce an approximately linear increase of its resistivity (R) 66, i.e., decrease of conductivity, which can be a result of an increase of the distance between the conductive elements comprised within. Phase II of FIG. 2E illustrates a touch-sensitive element 400 undergoing further indentation when a PHAST undergoes a further compression 64, which may be induced by a compression force 60. A further compression may be important enough to deflect and compress both the matrix 416 and the touch-sensitive element 400 to induce significant compression of this last component. A compression 62 of a touch-sensitive element 400, similar to the example illustrated in phase I of FIG. 2E, can induce a non-linear decrease of its resistivity 68, i.e., increase of conductivity, which can be a result of a decrease of the distance between the conductive elements when the touch-sensitive element is compressed. Someone skilled in the art will appreciate that a phase II that may start to appear before the end of a phase I may induce a relative change of resistance that can resemble a wave or a peak that can be characterized as phasic response 50, e.g., see the various examples of phasic signals presented in FIG. 1 or the exemplary phasic response of a PHAST subjected to a simple discrete pressing touch held for five seconds presented in FIG. 2F. It will be further appreciated that the resulting phasic signal may be attributed to a choice of material most importantly for the matrix 416 and the touch-sensitive element 400 as well as their respective physical properties.

Figure 2F:
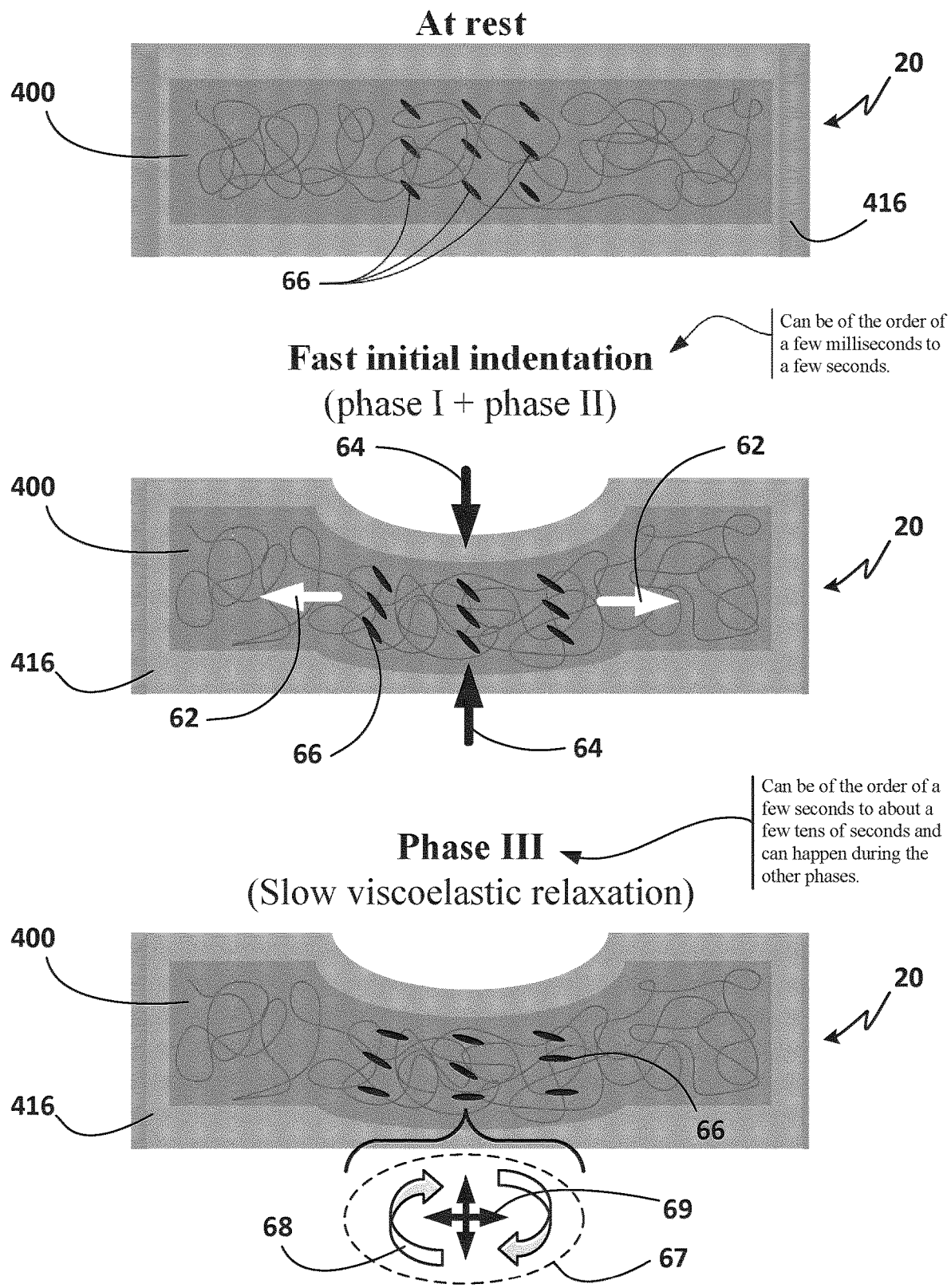
FIG. 2F shows a schematic representation of a viscoelastic relaxation that can affect the resistivity of a touch-sensitive layer.

The second hypothesis previously introduced to explain the phasic nature of the signal consider a competition between the fast mechanisms (phase I and phase II) described above that can induce a quasi-linear response and an additional phenomenon (phase III) that may be associated to a viscoelastic relaxation of the viscoelastic component of the phasic taxel 20 can be present and can contribute to a non-linear change of resistivity of the touch-sensitive element 400. In the case of most viscoelastic material, a viscoelastic relaxation of the order of about a few seconds to about a few tens of seconds can be qualified as relatively slow when compared to the mechanical deformation associated with the phases I and II that can be of the order of a few milliseconds to about a few seconds. Therefore, it will be appreciated that a viscoelastic relaxation (phase III) can often be associated with a slow deformation or slow rate of indentation or a maintained constant indentation. FIG. 2F presents a schematic illustration of an exemplary viscoelastic relaxation of a constant maintained indentation (lower illustration) after a fast initial indentation (central illustration), where a set of nine markers corresponding to a schematic representation of conductive particles 66 to help illustrate the effect of the viscoelastic relaxation. The middle schematic representation of FIG. 2F summarizes a fast initial indentation that can induce, as previously described, both an increase of distance between the conductive particles 66 (stretching 62 of the touch-sensitive elements 400) that can correspond to phase I and a decrease of distance between the conductive particles 66 (compressing 64 of the touch-sensitive element 400) that can correspond to phase II. Mechanical properties of viscoelastic materials often allow for a relaxation and a relatively slow realignment of viscoelastic components of the PHAST as illustrated in the lowest exemplary schematic representation of FIG. 2F. Such a slow realignment of the viscoelastic components may allow for the reorganization 67 of some of the conductive particles of the touch-sensitive element 400 that can include a rotation 68 and/or a tridimensional translation 69 and/or a sequence of such realignments. In some embodiments, such a reorganization 67 can result in a reduce distance between the conductive particles 66 and/or an increase of their contact area, which can induce an increase of conductivity (decrease of resistivity) and improve exchange interaction between conductive particles that can be attributed to quantum tunneling. In some embodiments, such a reorganization 67 of elongated (e.g., filiform) particles can result in an increase/decrease of the effective surface area of contacts between the particles, which may contribute to a decreasing/increasing of resistivity, respectively. It will be appreciated that a viscoelastic relaxation can reduce the amplitude of the phasic signal (peak) and therefore reduce the detectability of the corresponding touch.

Figure 2G:
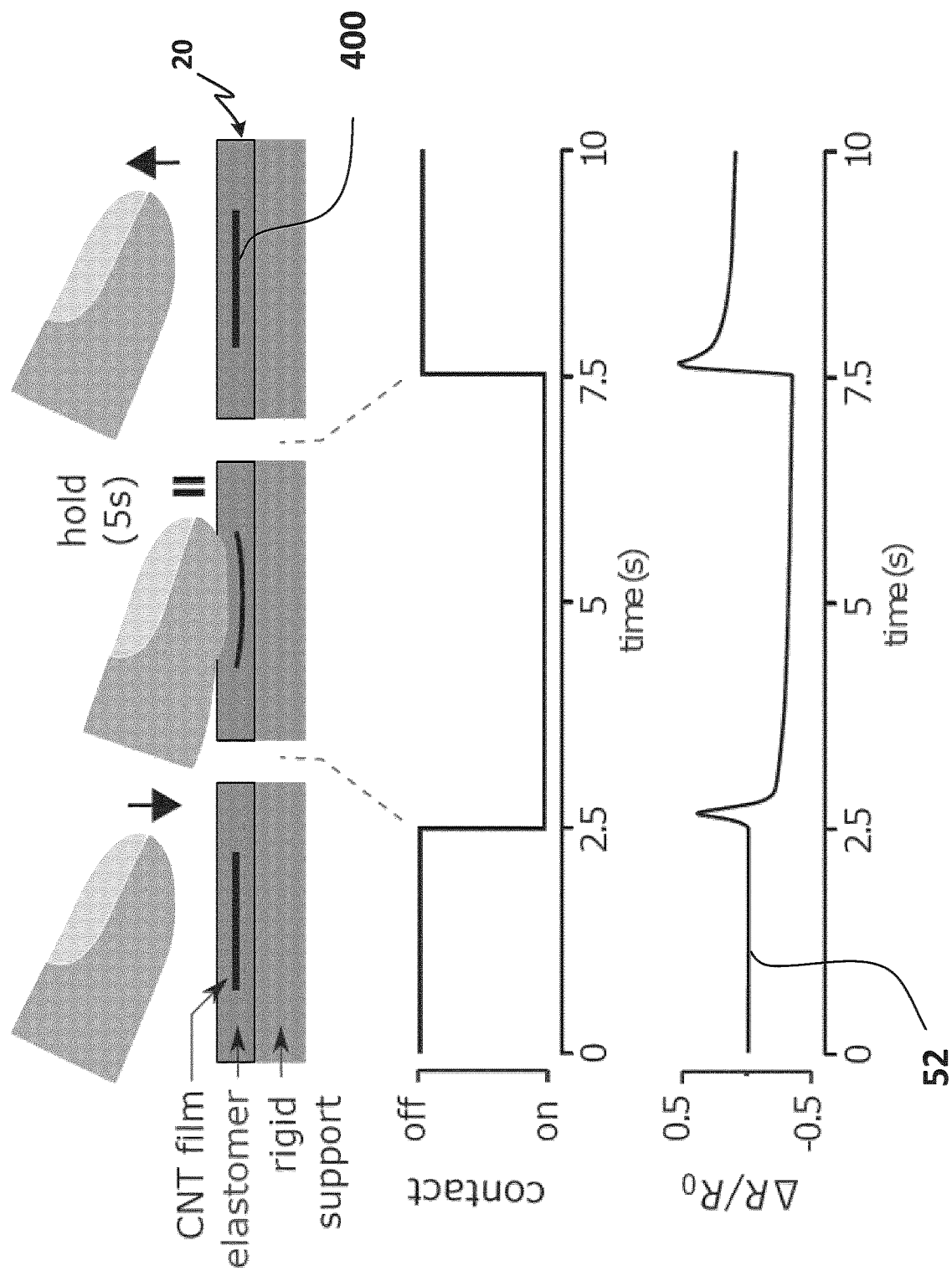
FIG. 2G shows an exemplary phasic response of a PHAST subjected to a simple discrete pressing touch held for five seconds.

FIG. 2G illustrates a possible phasic response 52 resulting from a user interaction with an embodiment of a PHAST sensing units. Deformation can induce a resistive variation of the touch-sensitive element 400 that can exhibit a sharp peak at the onset of contact (around 2.5 seconds) and at its termination (around 7.5 seconds). The height and width of such sharp peaks can depend on the characteristics of a contact, which may modulate two of the possible parameters, such as the intensity and/or duration of the signal. Adjusting the concentration of the conductive particles of the touch-sensitive layer, and other factors, can allow to obtain a wide range of various sensing properties.

Figure 2H:
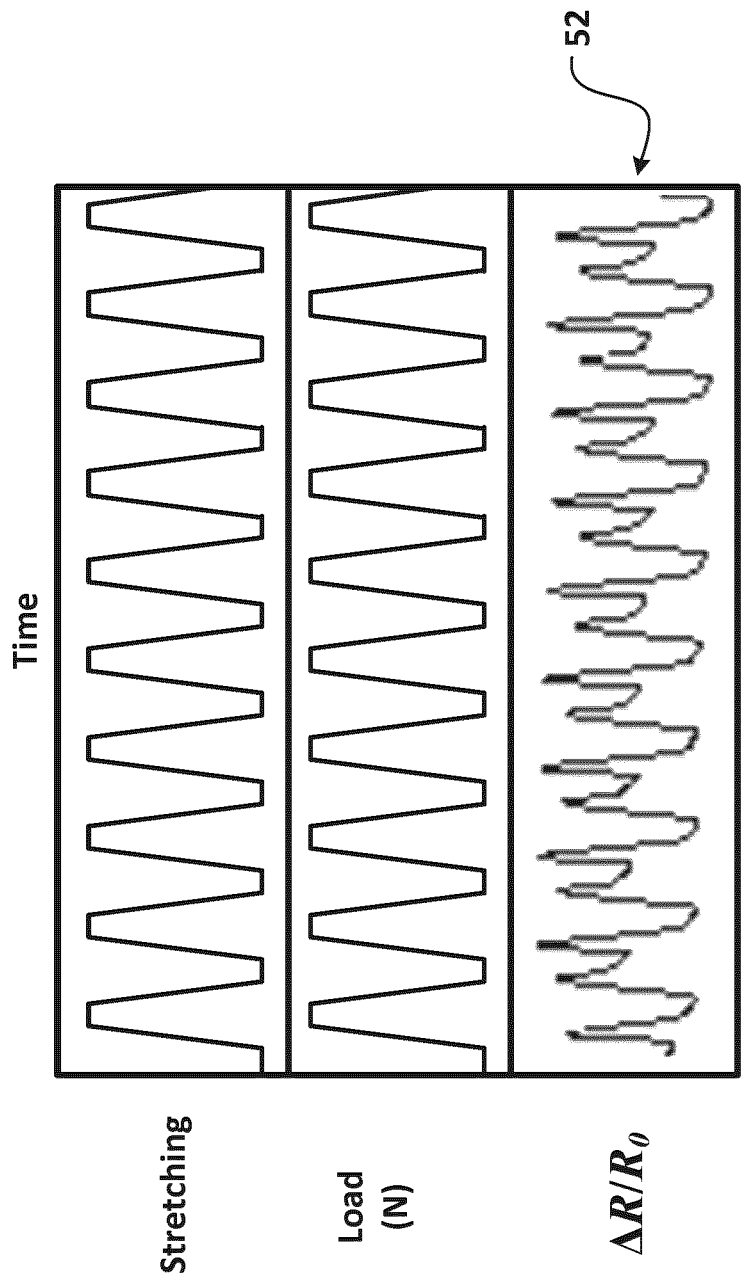
FIG. 2H shows an exemplary phasic response of a PHAST subjected to ten cycles of a simple discrete stretching held for a few seconds.

FIG. 2H presents an exemplary phasic response of a PHAST subjected to ten cycles of a simple discrete stretching held for a few seconds. It will be appreciated that the relative change of resistivity resulting from stretching of a PHAST can also be characterized as a phasic signal.

FIG. 3A presents measurements (curves) of some embodiments of the load as a function of deflection 88, which can be characterized as rate-dependent hysteresis loops. The curves presented in FIG. 3A can show nonlinear stiffening which can typically be associated with Hertzian contact mechanics or as rate-dependent hysteresis loops that can be attributed to the viscoelasticity of the elastomeric matrix of the PHAST. A three-parameter generalized Maxwell model with characteristic time of about ten seconds can describe the behavior of the embodiments of FIG. 3A. FIG. 3B presents measurements of some embodiments of the load rate as a function of deflection 90, which may suggest that a change of deformation regime can take place at around 0.4 mm of indentation.

FIG. 3C presents measurements of some embodiments of the relative change of resistance ($\kappa = \Delta K/K_0$) as a function of deflection 54 and a smooth approximation 55 of the experimental curve of one embodiment, which can be expressed with the following equation, where a is a scaling factor and a describes the spread of the response (width of the curve). It will be appreciated that the approximation of equation 1 can be independent on whether the sensor was loaded or unloaded.

$$\kappa(\delta) = \delta^2 g(\delta), \text{ where } g(\delta) = ae^{\frac{-\delta^2}{2\sigma^2}} \quad (1)$$

$$\kappa(\delta) = \delta^2 ae^{\frac{-\delta^2}{2\sigma^2}}$$

It is proposed that the biological mechanoreceptors may gain their phasic properties through static nonlinearity of the type in equation 1. Models of molecular mechanisms that produce phasic responses in mechanoreceptors are as of yet largely unknown.

In some embodiments, a change of amplitude of the curves of FIG. 3C may be used to characterize a rate of deflection of the touch action. It will be appreciated that the change of amplitude of the curves of FIG. 3C for various rates of indentations (0.1, 0.5 and 1.0 mm/s) may be associated in part to the viscoelastic relaxation which may be closely related, due to its slow realignment, to the speed of indentation (rate of indentation). A slower rate of indentation may allow for a viscoelastic relaxation to appear and can contribute to dim or reduce the effects of both phase I and phase II, therefore a change of resistivity (curves of FIG. 3C) can be lowered or dimmed.

FIG. 3D presents derivatives of $\kappa(\delta)$, the relative change of resistance as a function of deflection of FIG. 3C, corresponding to variations of the relative change of resistance as a function of deflection ($\partial \kappa/\partial \delta$) 56. A smooth approximation of the experiment curves 57 of the embodiments presented in FIG. 3D can be expressed with the following equation.

$$\frac{d\kappa}{d\delta} \approx \frac{d(\delta^2 g)}{d\delta} = \left(2\delta - \frac{\delta^3}{\sigma}\right)g \quad (2)$$

Since δ can be a function of time, the smooth approximation can be shortened to the following equation.

$$\frac{d\kappa}{d\delta} \approx \dot{\delta}\left(2\delta - \frac{\delta^3}{\sigma}\right)g \quad (3)$$

This last equation can be used to capture the sensitivity of the sensor cell to the rate of indentation as it could be observed in FIG. 3B. For some embodiments, the sensor response can be quicker for higher indentation rates. Equation 3 can further be used to predict that, for a same indentation rate, the response is higher for greater deflections, which can also be observed for the curves of FIG. 3A.

The response captured by equation 1 can be grounded in the physics of the sensor. Some embodiments could follow from standard piezoresistivity (see the section about the standard gauge equations of the brief summary of piezoresistivity below) which describes the relative variation of resistance of an elongated element. The model combines the intrinsic variation of specific resistivity of the material ($\Delta\rho/\rho$) owed to the strain ($\epsilon$) to which the element is exposed and the effect of dimensional changes represented by axial and transverse strains, $\epsilon_a$ and $\epsilon_t$, respectively. For standard piezoresistivity and if ν is the Poisson ratio of the conductive material, then the change relative change of resistance can be expressed as a function of the strains with the following equation.

$$\kappa(\epsilon) = \frac{\Delta\rho}{\rho} + \epsilon_a(1 + 2\nu) = \frac{d\rho}{\rho} - \epsilon_t\left(2 + \frac{1}{\nu}\right) \quad (4)$$

Someone skilled in the art would appreciate that the relative change of resistance observed for the presented embodiments, which shows a reversal of the sign of the change of resistance empirically observed in FIGS. 3C and 3D, does not respect the presented standard piezoresistivity of equation 4.

A more detailed model could appeal to the properties of percolation networks. Their behavior is modeled by evaluating the average length and number of junctions established in a heterogenous conductor-insulator mixture (33). When the number of junctions is assumed to be constant, the relative change of resistance can take the form (see the section about the percolation networks of the brief summary of piezoresistivity below) of the following equation, where γ is a constant involving the mass and charge of an electron, Planck's constant, and the potential barrier between the conductive particles, and where $s_0$ is the effective distance between the conductive particles that are loosely connected in a three-dimensional network.

$$\kappa = e^{\gamma s_0 \epsilon_a} - 1 = e^{-2\gamma s_0 \epsilon_t} - 1 \quad (5)$$

Figure 4A:
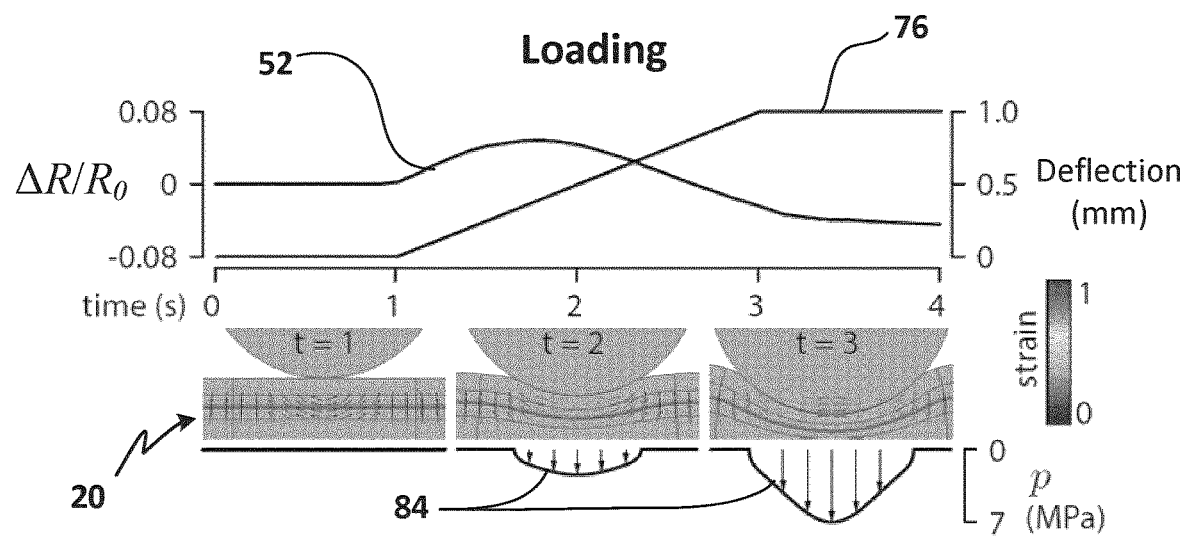
FIG. 4A shows the result of the simulation of the progressive indentation by a cylindrical probe in the sensor cell with arrows showing the direction and magnitude of a principal strain.
Figure 4B:
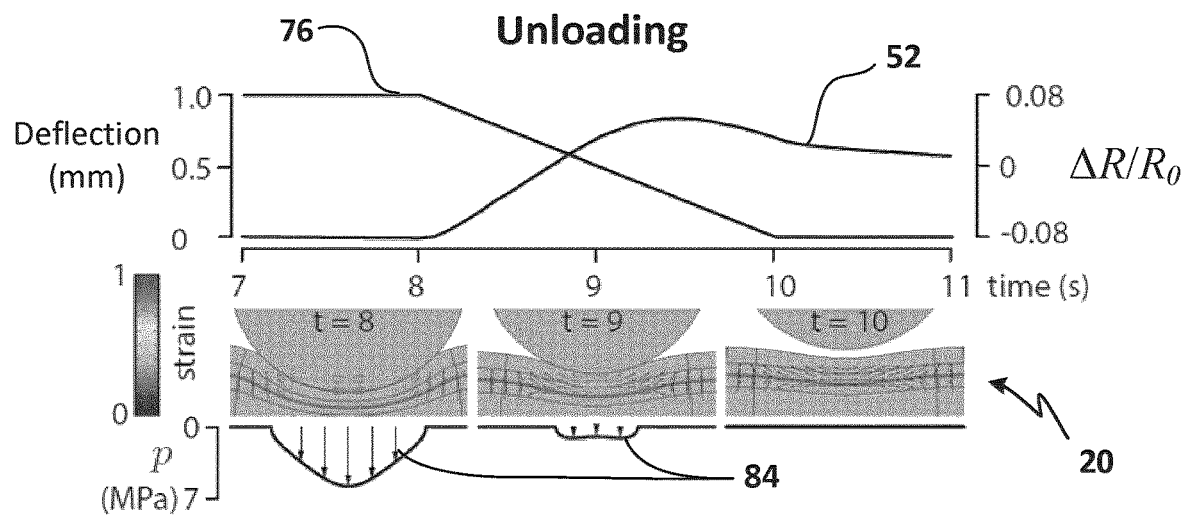
FIG. 4B shows the result of the simulation of the unloading sequence after a five-second plateau at fixed indentation by a cylindrical probe in the sensor cell with arrows showing the direction and magnitude of a principal strain.

In some embodiments, an increase of resistance can be attributed to an increase of the average distance between the conductive particles that can exponentially reduce the probability of electrons to tunnel through junctions. Slabs of CNT films, which can be used as the conductive particles in some embodiments, were shown to verify this model. The nonlinear relationship expressed by equation 5 is nevertheless still unable to explain the observed sign reversal of the change of resistance that can be observed in some embodiments. Since there is no known closed-form solution to such a contact problem as explained by Hayes et al. (DOI: 10.1016/0021-9290(72)90010-3) or Stevenovic et al. (DOI: 10.1063/1.3676580), FIGS. 4A and 4B present a finite element simulation (2D planar case, COMSOL Multiphysics, Stockholm, Sweden) to help illustrate the possible mechanisms behind the reversal of resistance observed for some embodiments. The simulation can suggest that the spherical probe may initially deform the sensitive film, which may comprise conductive particles that are loosely connected in a three-dimensional network, in a manner that resembled a Hertzian contact problem. However, the elastic layer mounted on a rigid support can cause an infinite half-space approximation to no longer be applicable in the later stages of the indentation. In these simulations the principal strain can grow increasingly fast and a larger portion of a film can be recruited when the probe approaches the support. This can be visualized by plotting the surface pressure profile $p(r)$ 84, which can be observed to be proportional to $\sqrt{1-r^2/R^2}$. In some embodiments, a 0.7 mm of indentation departed significantly from the Hertz model.

Figure 5A:
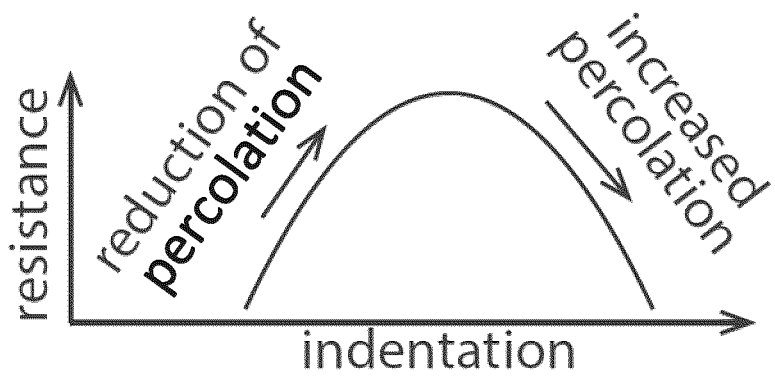
FIG. 5A shows a qualitative model of the interplay of two piezoresistive phenomena which may be at the origin of an increase or decrease of resistivity.

FIG. 5A presents a model of equation 1 describes the empirical response of some embodiments of the sensor cell by the combination of two effects, the reduction of junctions and the increasing percolation as a function of indentation (deflection $\delta$). A hypothesis puts forward that, in some embodiments, an increase/decrease of paths allowing for electrical percolation can be caused by a decrease/increase distance between the conductive particles, which may result in an increase/decrease of electrical connection (i.e., decrease/increase of resistivity) of the three-dimensional network of conductive particles, respectively. In some embodiments, the viscoelasticity of the flexible matrix can cause material relaxation under explaining the slow response at constant indentation and the asymmetry between the loading and unloading phases in the empirical measurement and in the simulation.

In some embodiments, the complete response to indentation could be explained by a nonlinear model formed by the product of a Gaussian function $g(\delta)$ and of a parabola ($\delta^2$), such as the equation 1 for example. In some embodiments, the dynamic response can further be associated with a product of the temporal rate of indentation and of the rate of change of the response to indentation, such as in equation 3 for example. In some embodiments, one of the crucial points can be the change of sign of the response's rate of change, which can give a sensor a phasic character through mechanical nonlinear filtering. It only responded to changes in indentation. This property could also be captured by a Gaussian wavelet centered around a specific value of the indentation ($\delta_r$) where the change of resistance changes sign ($\approx 0.4$ mm for some of the presented embodiments). The derivative of the response of some embodiments with respect to indentation could then be given by a Gaussian multiplied by the first Hermite polynomial, $-\sigma^{-2}(\delta-\delta_r)g(\delta-\delta_r)$. Rational expressions, splines, and other options may also be available to represent the empirical results, $a\delta^2/(b+\delta^6)$, for example.

Figure 5B:
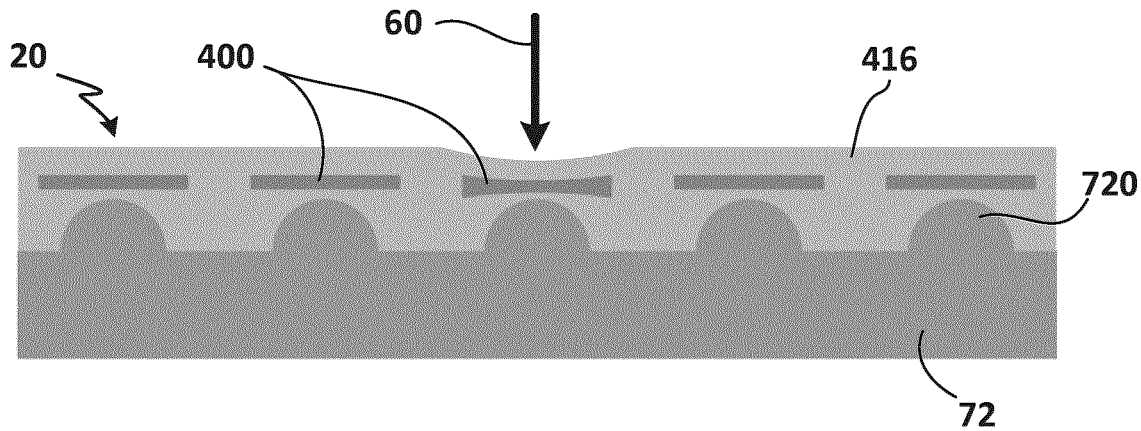
FIG. 5B shows a possible embodiment that may comprise an inverted design with protuberances on a rigid support surface.

It will be appreciated by someone skilled in the art that the sensory response described herein can vary according to numerous design factors including the geometry of the surface impinging on the three-dimensional network comprising the conductive particles, the thickness of the three-dimensional network, the concentration of conductive particles, the material properties of the elastomeric matrix in which they are embedded, the geometry and the material properties of the viscoelastic (elastic and viscous) medium in which the three-dimensional network is embedded. The design space of sensing embodiments based on similar principles can be large. It will be appreciated that the possible embodiments may not be limited to the touch-sensitive devices presented herein. FIG. 5B present a possible embodiment that may comprise an inverted design with textured patterns 720 (e.g., protuberances) on a surface of the rigid support 72 to obtain the desired nonlinear characteristics, which could have advantages for use as an artificial skin.

DESCRIPTION OF SOME EXEMPLARY EMBODIMENTS

The following paragraphs present an exemplary embodiment of one of the methods of fabrication of a phasic touch-sensitive device, here referred to as PHAST, and also present an exemplary method of assembling a touch-sensitive matrix or array, here referred to as e-skin, comprising a plurality of the phasic touch-sensitive layers.

Figure 6:
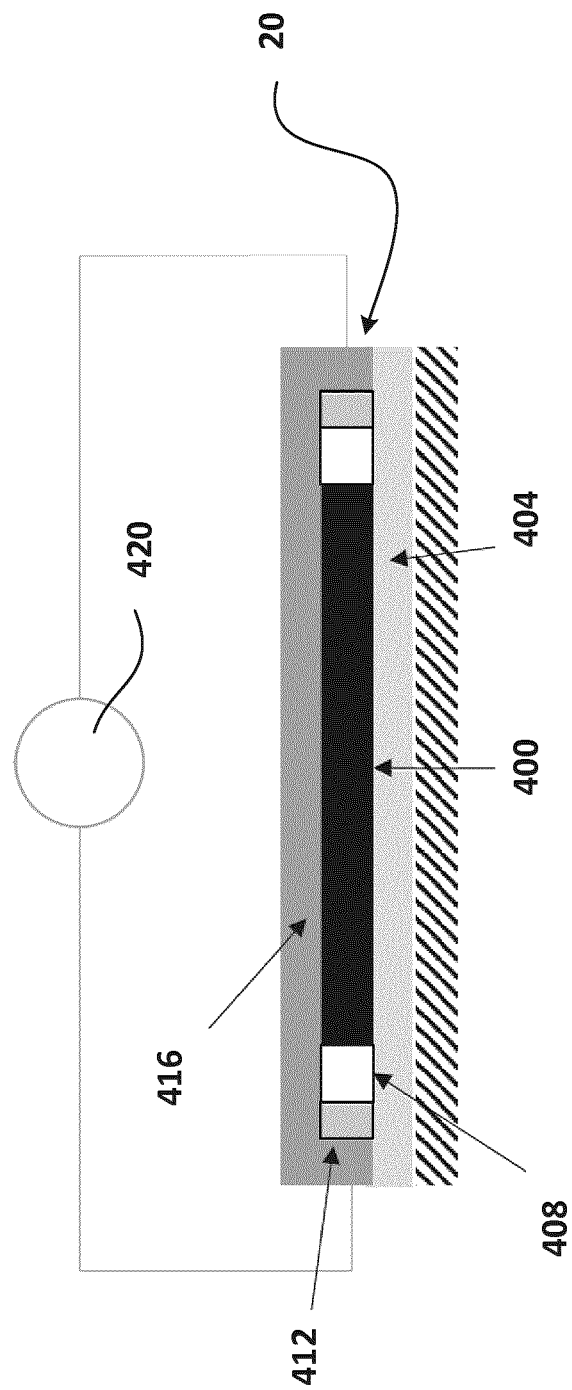
FIG. 6 shows a schematic representation of a cross-section of a side view of a cross-section of an embodiment of a PHAST.

FIG. 6 presents a schematic representation of a side view of a cross-section of an embodiment of a PHAST 20 comprising a bottom substrate 404 part of an encapsulating matrix 416, interconnection 408, connectors 412, and a captor for measuring the resistance 420 of the touch-sensitive element 400. In some embodiments, the substrate 404 can be used as a base on which to layer the touch-sensitive element 400, or spray coat a liquid solution that can comprise the conductive particles to produce the touch-sensitive element 400, and support the various components of the PHAST 20. The substrate 404, that can be shaped by spin coating, spray coating, molding or alternative methods, can be made out of one or more polymers and can also comprise surfactants to increase wettability. It will be appreciated that the substrate 404 can have various thicknesses and shapes, e.g., can be microstructured, that can be adjusted as required. In some embodiments, the touch-sensitive element 400 can comprise a loosely connected three-dimensional network of conductive particles which may or may not have a specific orientation. In some of the preferred embodiments, the conductive particles can be carbon nanotubes (CNT), which allows for a significant change or resistivity for a minimal indentation of the touch-sensitive layer. In some embodiments, the CNT can be organized in a stack of two-dimensional layers or a three-dimensional network, here referred to as a CNT film, that can be laid down on the substrate with variation of spray coating techniques. It will be appreciated that the conductive particles can be of a wide range of shapes and can be made of any compatible material that may allow to change the conductivity of the touch-sensitive element when subjected to variable touches (pressures, rubbings and/or vibrations), where this change of conductivity can follow a phasic pattern. Interconnections 408, which can be made out of conductive polymers, can be used as a bridge between a touch-sensitive element 400 and connectors 412 to ensure a mechanical and electrical connectivity between at least those last two components and can further induce some mechanical resistance to the structure of the PHAST 20. Connectors 412 are conductive components, which can comprise electrodes, that can be used in some embodiments to transfer electric currents, to input and/or pickup the electrical signal diffused in the touch-sensitive element 400 and/or interconnections 408. In some embodiments, the electrodes of the connectors 412 can be metallic components that can comprise flexible and/or rigid printable circuit board (PCB). It will be appreciated that the electrodes may be further coated with conductive coating to improve their electrical contact, such as a gold coating, for example. In some embodiments, the matrix 416 can be used to encapsulate or seal the components of the PHAST 20 can be a flexible and/or elastomeric and/or viscoelastic matrix that can be made out of a polymer, which may further define and be used to control some of the mechanical properties of the PHAST that can allow for a relaxation of mechanical constraints during the stationary phases of various touches. In some embodiments, a resistance measurement captor 420 may be used to process a non-linear signal like a phasic electrical signal, such as the one that may be generated by the presented embodiments of the proposed touch-sensitive element 400.

FIG. 7A presents some of the main steps of fabrication of possible embodiments, A) including layering of the touch-sensitive element 400 over a substrate 404, B) applying conductive polymer patterned electrodes and C) encapsulation. FIG. 7B present one embodiment of a PHAST with added circuitry held in a hand for scale. FIG. 7C present a microscope image of an exemplary embodiment of a touch-sensitive element where the conductive particles are clearly visible. In some embodiments, the conductive particles of the touch-sensitive element can be carbon nanotubes of various types, such as single-walled, multi-walled, pure, functionalized, long, short or others. In the embodiment presented in FIG. 7C, the touch-sensitive element can be obtained by spray coating a carbon nanotube solution. In some of the preferred embodiments, the carbon nanotube solution is an aqueous solution that can comprise purified short-multi-walled carbon nanotubes 0.1 to 0.5 vol % (0.1 to 0.5 mg/mL) suspended in deionized water with a surfactant (0.5 to 1 mg/mL) that may be sodium dodecyl sulfate (SDS) and/or NaDDBS and/or Triton X-100 or others. The aqueous carbon nanotube solution can be mixed in an ultrasonic bath during 20 min receiving around 2000 J.

In some embodiments, the substrate 404 can be resulting from curing of a gel that can comprise Polydimethylsiloxane (PDMS) (e.g., Sylgard 184, Dow corning, Midland, MI, USA) mixed from a base and a curing agent in proportion of 10:1. After degassing in a vacuum chamber for example, the resulting gel can be cast on cleaned silicon wafers that can be coated with a silicone releaser (e.g., Ease Release 200, Mann Release Technologies Inc., PA, USA). In some embodiments, an additional spin coating can be used to remove an excess of gel. Substrates can be cured at ambient temperature for 24 hours or with the use of an oven to accelerate the process. It will be appreciated that a surfactant can be used in some embodiments (e.g., Triton X-100, 3 wt %) to increased wettability.

In some embodiments, to generate a touch-sensitive element 400 on a substrate 404, as presented in FIG. 7A, the substrate held at about 130° C. can be spray-coated with an aqueous carbon nanotube solution which may be airbrushed at about 1.7 bars. In some embodiments, shadow masks can be realized to control the shape of the touch-sensitive element as required by laser cutting and a desired resistivity of the touch-sensitive element can be achieved by adding layers of spray-coated carbon nanotube solution, therefore changing the thickness of the touch-sensitive element that can be of a few micrometers. In some embodiments, the resulting CNT film can be washed in water and can be dried with a hotplate or ambient air.

Figure 8A:
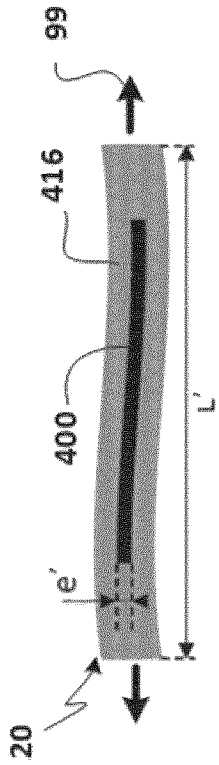
FIGS. 8A and 8B show a schematic representation of a cross section of a side view of a PHAST being flexed and stretched.
Figure 8B:
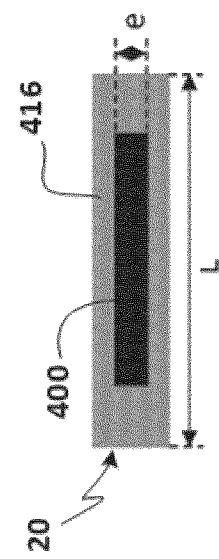

In some embodiments, interconnection 408 and connectors 412 can be made with various conductive polymers, such as PDMS based with Long-MWCNT carboxylic acid groups (e.g., Ad Nano Technologies LTD, Karnataka, India) that can be diluted in $CHCl_3$. In some embodiments, the contact between an interconnection and a touch-sensitive element can require a good electrical affinity to ensure that the signal output is not significantly modified and/or to improve the lifespan of the resulting PHAST. In some embodiments, the solution can be shear-mixed at 300 rpm for 6 hours where $CHCl_3$ can be further added to preserve viscosity. A curing agent can then be added in proportion of 10:1 before applying it, in some cases by screen printing, on the substrate with the CNT films (like the one presented in step A of FIG. 7A) to produce electrodes (connectors 412) and connecting them to the touch-sensitive element 400 as illustrated in the example of step B of FIG. 7A. The conductive polymers can be further cured at higher temperatures that can be of about 100° C. The resulting product can be encapsulated as illustrated in the example of step C of FIG. 7A. In some embodiments, the encapsulation 416 can be made out of various materials that can be flexible and/or elastomeric and/or viscoelastic such as polymers. In some embodiments, the material for encapsulation 416 can be a polymer similar to the one used for the substrate 404 as the previously described PDMS with various concentrations that can be chosen to be between about 5:1 and 20:1 to control some of the properties of the encapsulation 416. In some embodiment, the encapsulation 416 can be molded to structure the surface of the PHAST 20. In some embodiments, the encapsulation can be comprising more than one layer of a given material and can be comprising multiple layers of various materials, which can be arranged as required to control some of the mechanical properties of the resulting PHAST. It will be appreciated that the mechanical properties of the encapsulation can be an important aspect of a PHAST since it may directly influence the way the touch-sensitive element reacts (non-linear response) to various touches (pressures, rubbings and/or vibrations) and therefore can have a direct effect on its phasic response. In some embodiments, the phasic soft taxel (PHAST 20), which can be flexible and/or elastomeric and/or viscoelastic, can be adapted for various layout and surface, in which case it may be flexed and/or stretched 99 as illustrated in FIG. 8.

Figure 9A:
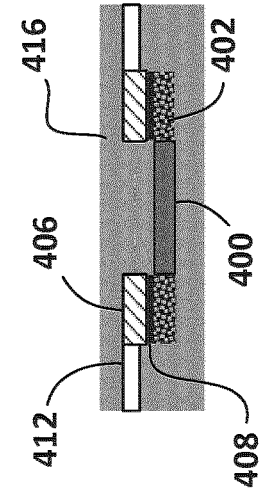
FIGS. 9A, 9B and 9C show schematic representations of a cross section of a side view of various embodiments of PHASTs having conductive components arranged in various ways.
Figure 9B:
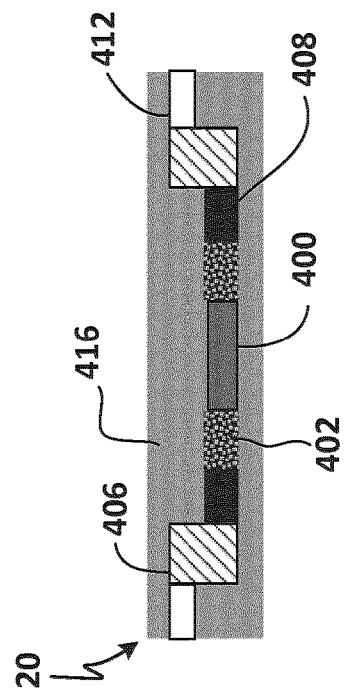
Figure 9C:
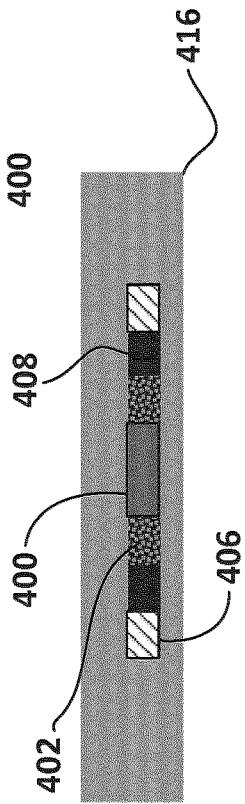
Figure 10A:
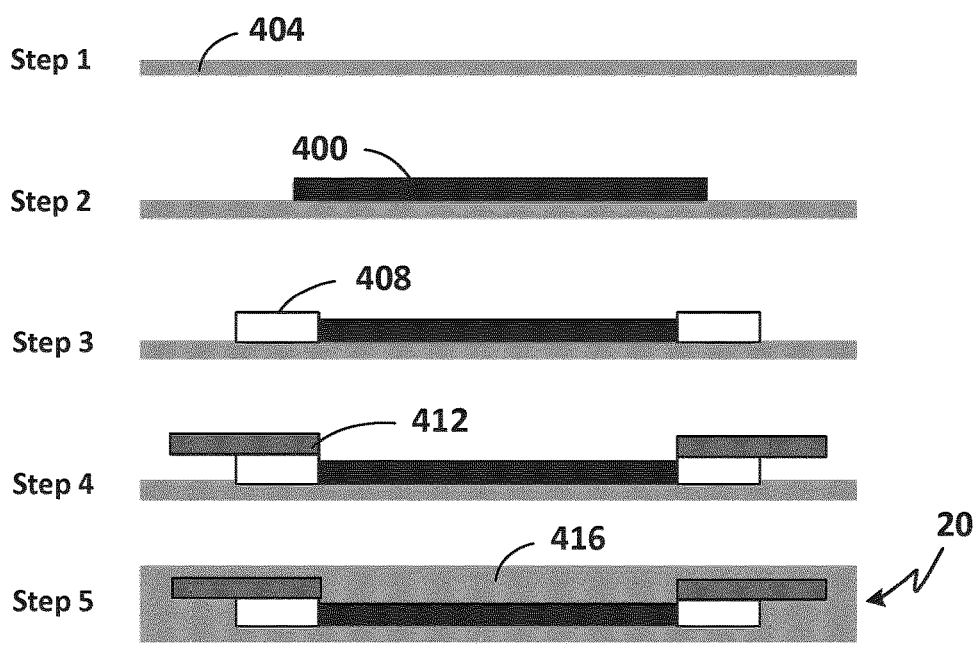
FIG. 10A shows a schematic cross-section of a side view of some of the steps of fabrication of an embodiment of a PHAST.
Figure 10B:
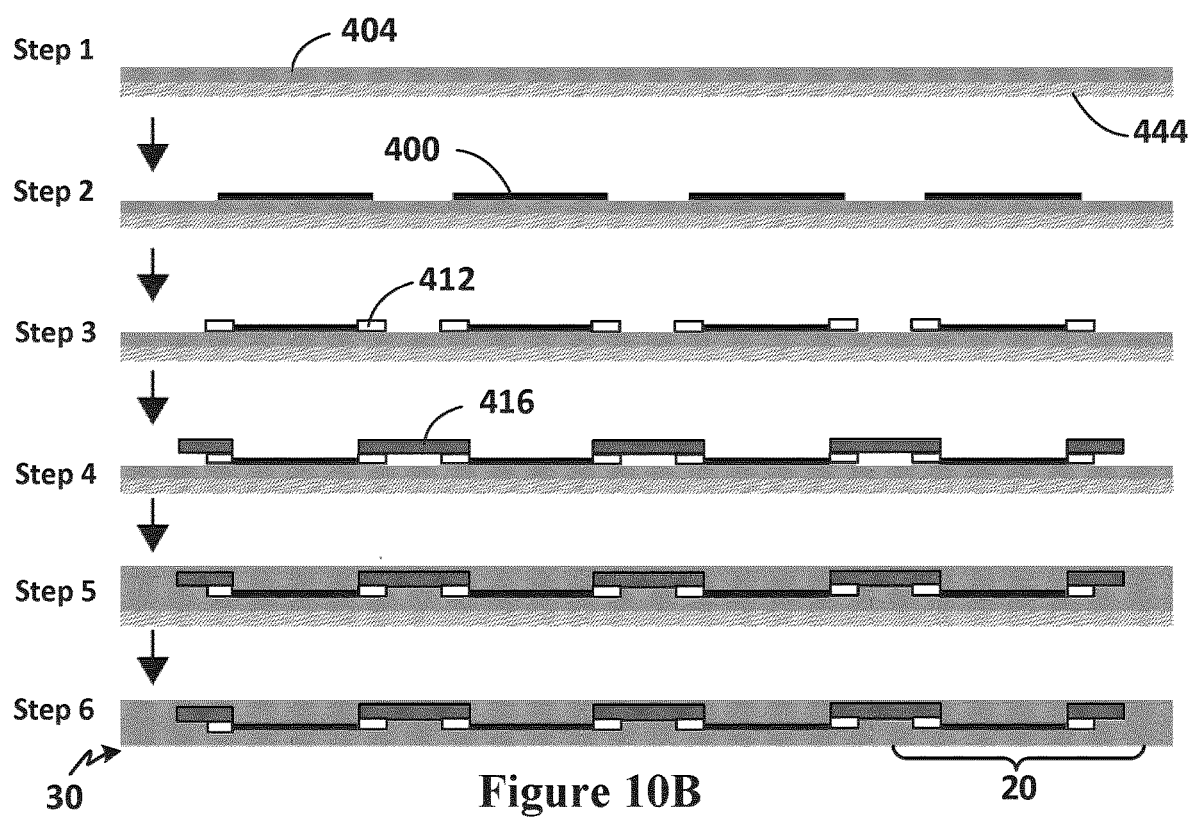
FIG. 10B shows a schematic cross-section of a side view illustrating some of the main steps of a fabrication process of an e-skin structure.

The various internal conductive components of the PHAST, for example the touch-sensitive element 400 (e.g., CNT film), interconnections 408 (e.g., cPDMS), connectors 412 (e.g., flexible PCB), a conductive polymers 402 (e.g., CNT films) that can be used as an interface between the touch-sensitive element 400 and the interconnections 408 and flexible conductive electrodes 406 (e.g., flexible PCB) that can be used as an interface between the interconnections 408 and the connectors 412, which may be arranged in various alternative ways. Therefore, the structure of a PHAST may be modified as required, which can allow it to be used for various applications and integrate in various products. FIG. 9 shows schematic side-view representation of various embodiments of the PHAST; where A) is an embodiment having its various conductive components are connected side to side; where B) is an embodiment where the conductive components are arranged in a more compact configuration (conductive polymers 402, interconnections 408 and flexible conductive electrodes 406 are connected and layered on top of each other) to reduce the length of the PHAST, which may allow to increase the resolution of an e-skin structure comprising a plurality of PHASTs; and where C) is another embodiment having its various conductive components are connected side to side and where the thickness of each component is controlled to reduce the overall thickness of the PHAST. FIGS. 10A and 10B present a schematic side view of some of the steps of fabrication of an embodiment of a PHAST 20 and e-skin 30 (array of PHASTs 20), namely step 1 of fabrication of the bottom viscoelastic substrate 404 (e.g., spin coating of PDMS onto a fabrication/molding support 444), step 2 of adding the touch-sensitive element 400 (e.g., pray coating the CNT film) on the bottom viscoelastic layer/substrate 404, step 3 of adding interconnections 408 (e.g., screen printing conductive polymer) to be electrically connected with (e.g., be in contact with) the touch-sensitive element 400, step 4 of adding the connectors 412 (e.g. routing of PCB connections) to be electrically connected with (e.g., be in contact with) the interconnections 408, step 5 of encapsulating (e.g., covering with an upper viscoelastic layer/substrate) and step 6 of releasing (e.g. removing the PHAST 20 from the fabrication/molding support 444). It will be appreciated that such steps of fabrications or their order can vary for alternative embodiments and may not be limited to these exemplary steps.

Figure 11A:
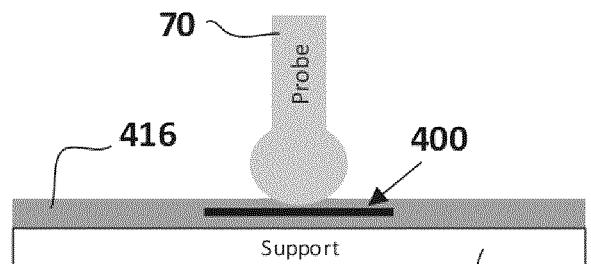
FIG. 11A shows a schematic cross-section of side view of some of the embodiments having a flat rigid support.
Figure 11B:
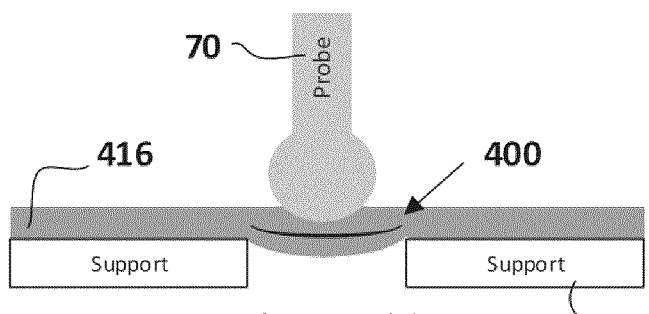
FIG. 11B shows a schematic cross-section of side view of some of the embodiments with a flat rigid support having holes under the touch-sensitive layer.
Figure 11C:
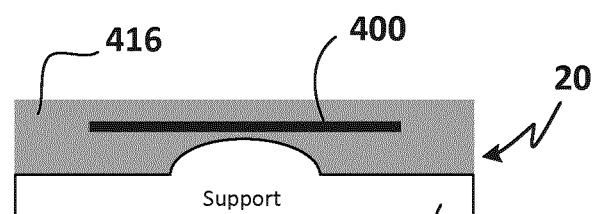
FIG. 11C shows a schematic cross-section of side view of some of the embodiments with a textured rigid support having protrusions under the touch-sensitive layer.
Figure 11D:
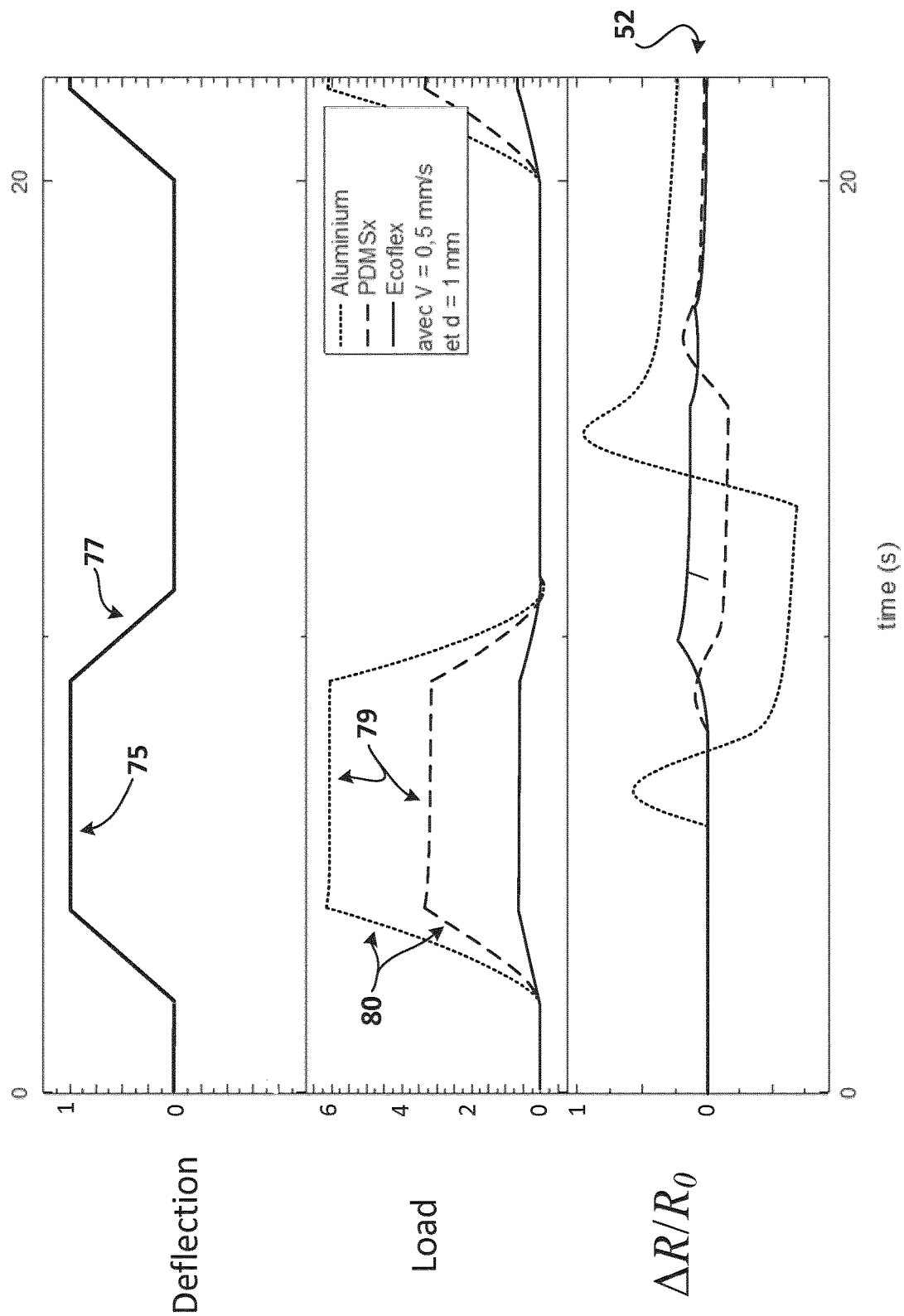
FIGS. 11D, 11E, 11F and 11G shows, for various speeds of deflections and various size of deflecting probes, experimental change of resistivity of touch-sensitive elements having various types of supports and being subjected to a similar deflection.
Figure 11E:
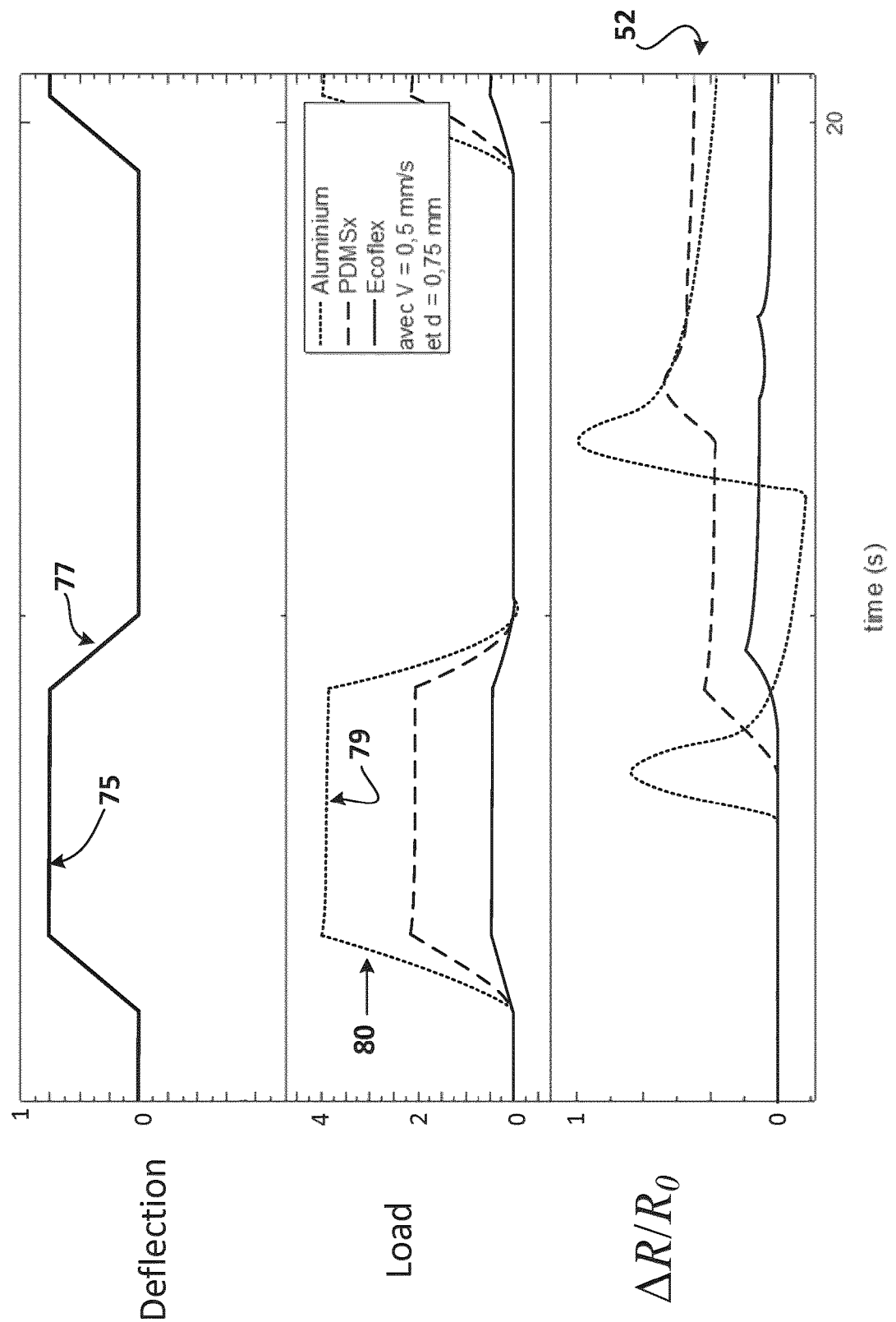
Figure 11F:
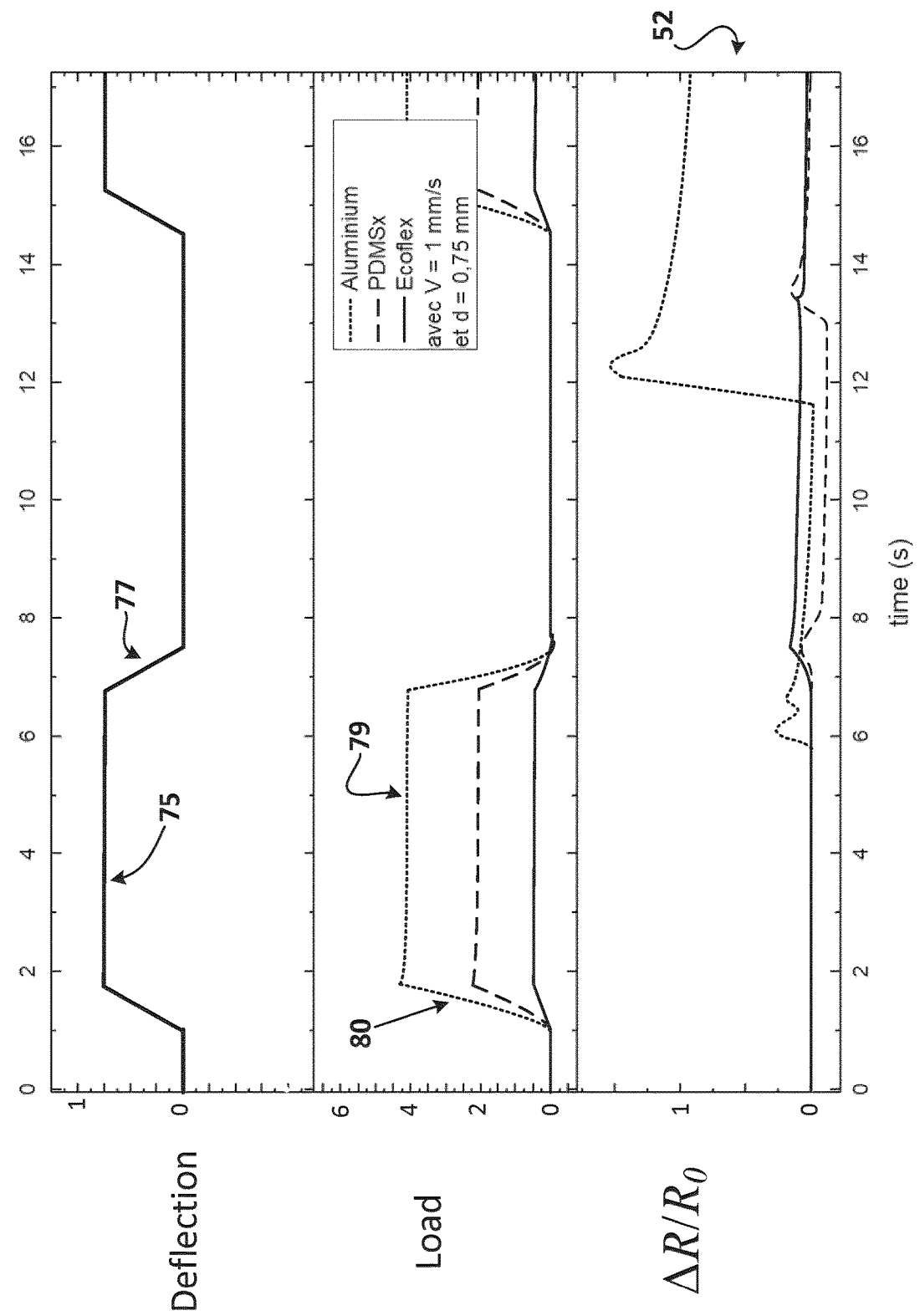
Figure 11G:
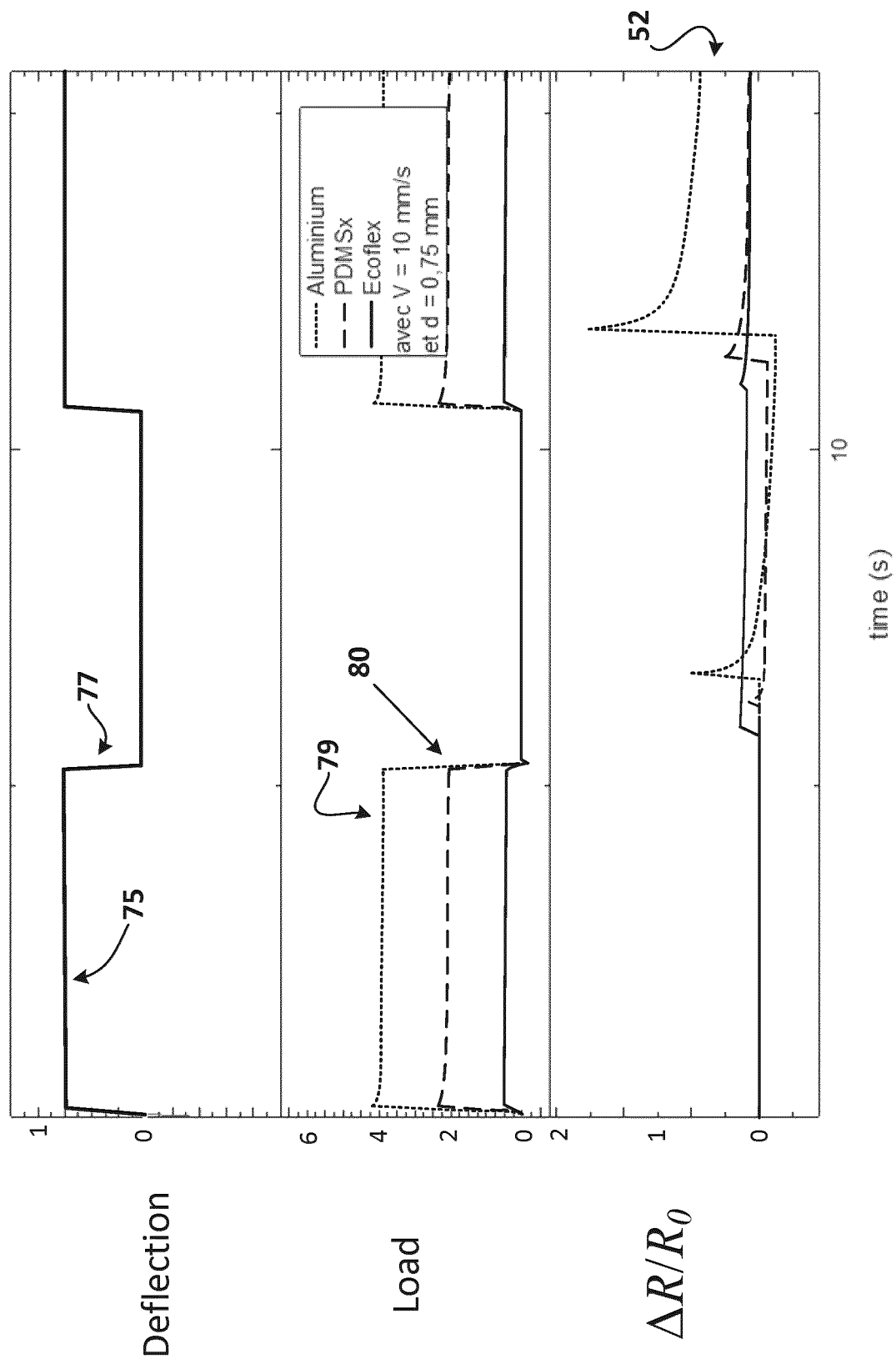

A PHAST may be placed on various support layers for supporting one or more of the encapsulation matrix 416 identified herein as rigid supports 72 as required by the application for which it will be used for. FIG. 11A present a schematic side view of some of the embodiments having a flat rigid support 72. FIG. 11B present a schematic side view of some of the embodiments with a flat rigid support 72 having holes under the touch-sensitive layer. FIG. 11C present a schematic side view of some of the embodiments with a textured rigid support 72 having protrusions under the touch-sensitive layer, similar to the embodiment presented in FIG. 5. It will be appreciated by someone skilled in the art that the rigid support can be combined or replaced entirely with various rigid support or alternative support, namely supports that slightly more rigid than the encapsulation matrix 416 or may not be rigid and can have any properties (e.g., pliability, flexibility, elasticity, strength) that may vary from the properties of the associated encapsulation matrix 416. Therefore, the support of the PHAST can comprise but is not limited to one or more material that is rigid or flexible or elastic or viscoelastic or a combination thereof. In some embodiments, the support 70 can be simply more rigid (less flexible) than the viscoelastic substrate 404. FIGS. 11D to 11G presents, for various speeds (V) of deflections and various deflecting probes having various diameters (d), raw experimental data of the relative change of resistivity of touch-sensitive elements having various types of 10 mm thick supports (aluminum, PDMSx and Ecoflex) and being subjected to a similar deflection. Although the signals are not perfectly aligned with the load and deflection curves, it can be appreciated that a phasic response can be measured for each of the various supports. The aluminum being more rigid than the PDMSx (PDMS with Triton X) being more rigid than the Ecoflex, comparing the various curves of the change or resistivity (phasic signal) can allow to observe that the amplitude of the signal can depend on the rigidity of the support 70. In other words, the more rigid the support, the more significant the phasic change of resistivity can be.

Various embodiments of PHASTs may be interconnected with one or more additional PHASTs to generate network touch-sensitive layers that can be referred to as an e-skin. The e-skin can comprise a plurality of PHASTs that can be produced individually or can be integrated to a production process that may interconnect them during production. FIG. 12A presents three embodiments of individual PHASTs that may be interconnected with other PHASTs and therefore be used as an e-skin. In some embodiments, such individual units can be manufactured by embedding multiwall CNT films in a soft silicone matrix. The CNT films can lead to the creation of conductive percolation networks that can nominally act as piezoresistive sensors with a typical resting resistance that can be of about 90 k$\Omega$. The manufacturing process of PHAST units may be extended to larger surfaces to create an e-skin.

FIGS. 12B, 12C and 12D present various embodiments of e-skin 30 that can comprise a plurality/array of PHASTs 20 that can be produced simultaneously. Piezoresistive CNT films can be spray-coated on a soft substrate and can be encapsulated with polydimethylsiloxane (PDMS). The resistivity of the PHAST units can be adjusted by their geometric shape and number of coatings. Ohmic interconnections between the flexible printed circuit board and the CNT film can be made of conductive polymer tracks. The manufacturing process may enable the uniform production of many sensors over large surfaces that may be on compliant and/or non-planar substrates. It will be appreciated that the resulting e-skin can made to be intrinsically robust, compliant, miniaturized, and/or printable which are characteristics that may be required for a desired product as recommended by S. Khan et al. (DOI: 10.1109/jsen.2014.2375203). E-skins may be easily customized in terms of the shape and morphology of the array of units (unit size and density). Conductive polymers and flexible PCBs may be used to connect PHAST units. As someone skilled in the art can appreciate, most conductive polymers may not achieve the required metal conductivity performance. To ensure conformability, metal interconnects may be a horseshoe serpentine pattern shown in the embodiment presented in FIG. 12C. FIGS. 12B, 12C and 12D show alternative e-skin structures produced with various processes. The embodiment presented in FIG. 12B comprises an array of 15 PHAST units (70 mm×100 mm each). The embodiment presented in FIG. 12C comprises an array of 160-PHAST stretchable e-skin with 160 PHAST units (200 mm×200 mm each). The embodiment presented in FIG. 12D comprises an array of 191-PHAST flexible e-skin (200 mm×230 mm each). Tactile arrays can often use column and row matrix structures with sensing units placed at the intersections of electrodes to simplify signal routing and increase resolution. The sensing units may be interfaced independently to simplify manufacturing and reduce crosstalk. This approach may also enhance the adaptability of the e-skin to different uses, that can be achieved by making it possible to increase the density in specific areas. It will be appreciated that printed PHAST units may not face miniaturization constraints.

In some embodiments, the array of PHASTs can be organized or arranged as required to fit the needs of resulting e-skin and is not limited to a specific predefined or ordered arrangement. In some embodiments, a plurality of touch-sensitive elements can be arranged to fit between the articulations (on the flat parts) of a robotic hand. FIG. 12F present an embodiment where various touch-sensitive elements 400 are arranged in a non-specific array and where the connection elements are applied first on the viscoelastic substrate 404. It will be appreciated that the density and resolution of the resulting e-skin (array of PHASTs and/or touch-sensitive elements) can be varied for a selected region or for various regions. Some embodiments can have larger PHASTs and/or touch-sensitive elements in some region of the e-skin (at the outer bounds, for example) and a plurality (a few hundreds, for example) of smaller PHASTs and/or touch-sensitive elements in one or more other region of the e-skin (in the middle, for example). In some embodiments, the array of PHASTs and/or touch-sensitive elements can be arranged in a concentric ring pattern. In some embodiments, each of the concentric rings of a concentric ring array can comprise a plurality of PHASTs and/or touch-sensitive elements, each having a chosen span of the ring's arc (for example; a number of n touch-sensitive elements, each covering approximately 360°/n of the arc). In some embodiments, the plurality of PHASTs that compose the concentric rings can have fixed dimensions (square, circular, etc.). In some embodiments, the size of the PHASTs may vary from one another as required (as a function of the radius, for example).

Figure 13A:
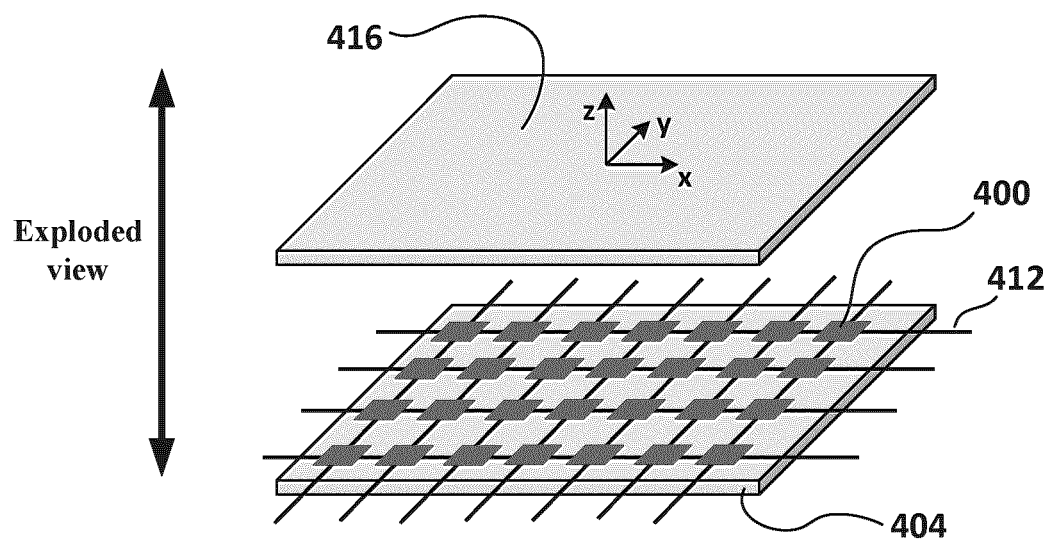
FIG. 13A illustrates an embodiment of an e-skin that comprises an array of PHASTs that can be used to determine the two-dimensional spatial position of a touch.
Figure 13B:
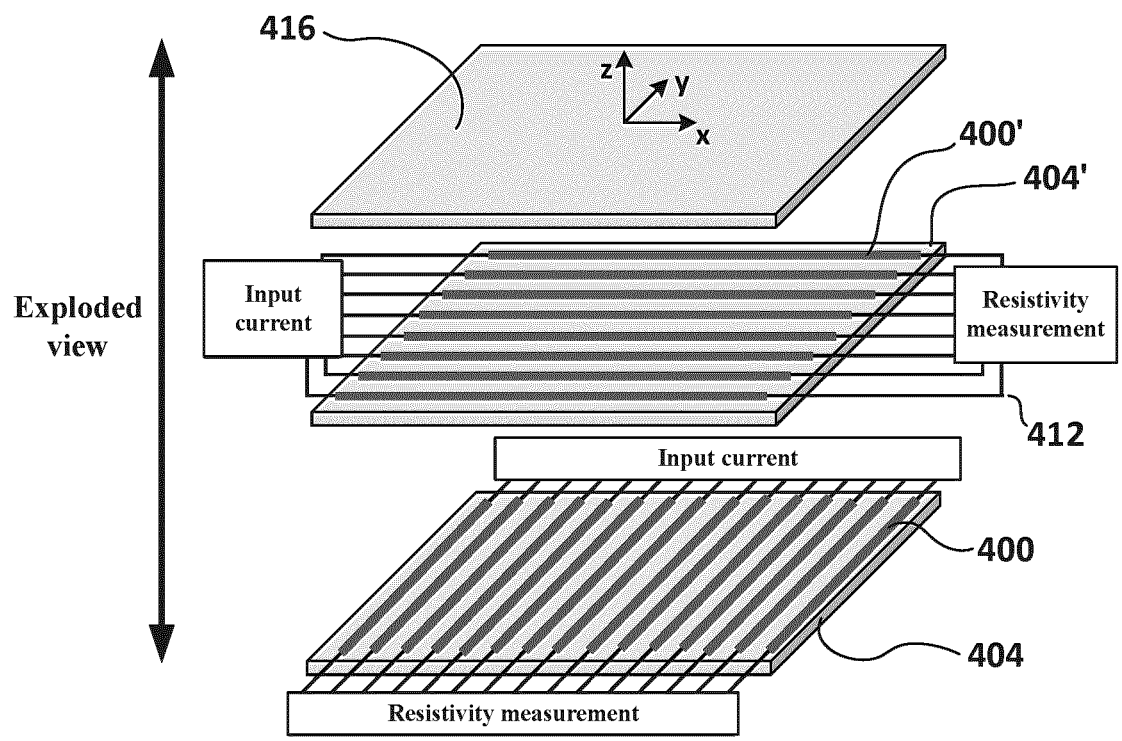
FIG. 13B illustrates an embodiment of an e-skin that comprises a stack of two arrays of PHASTs that can be used to determine the two-dimensional spatial position of a touch.

FIGS. 13A and 13B present various embodiments of arrays, namely various arrangement, patterns (e.g., periodic, random, checkerboard or lined pattern), geometries (e.g., circle, square, rectangle, polygon, cylinder, sphere, cone, pyramid, cube, cuboid or any 2D or 3D geometry) that can comprise a plurality of touch-sensitive element 400 that can be used to determine the two-dimensional spatial position of a touch. In the embodiment of FIG. 13A, the position of a touch may be directly associated with the position of the corresponding PHASTs that are solicited by the touch, which may correspond to array configurations of the embodiments illustrated in of FIGS. 1, 12B, 12C and 12D, for example. The embodiment of FIG. 13B presents two layers stacked in a cross-orientation arrangement, where each layer can comprise a parallel array of long and thin touch-sensitive element 400 that may allow to locate the position of a touch for a given dimension (in this embodiment, the bottom array can be used to identify the x position and the bottom array can be used to identify the y position), which may allow to extrapolate the two-dimensional spatial position of a touch. It will be appreciated that both embodiments can be modified to produce a wide variety of possible array of PHASTs for various e-skin configurations. The length of a long touch-sensitive element can be significant and, in some embodiments, can be of up to many tens of centimeters depending on the requirement of the embodiment. In some embodiments, the resolution and precision of the e-skin can be improved by changing the size of the PHASTs and/or by increasing the density of the array of PHASTs comprised in the e-skin. It will be appreciated that, though the intensity of measured change of resistivity can be reduced for longer touch-sensitive elements, being based on electrical percolation, small deformations of the PHAST can lead to significant variations of the resistivity of the touch-sensitive layer.

Figure 13C:
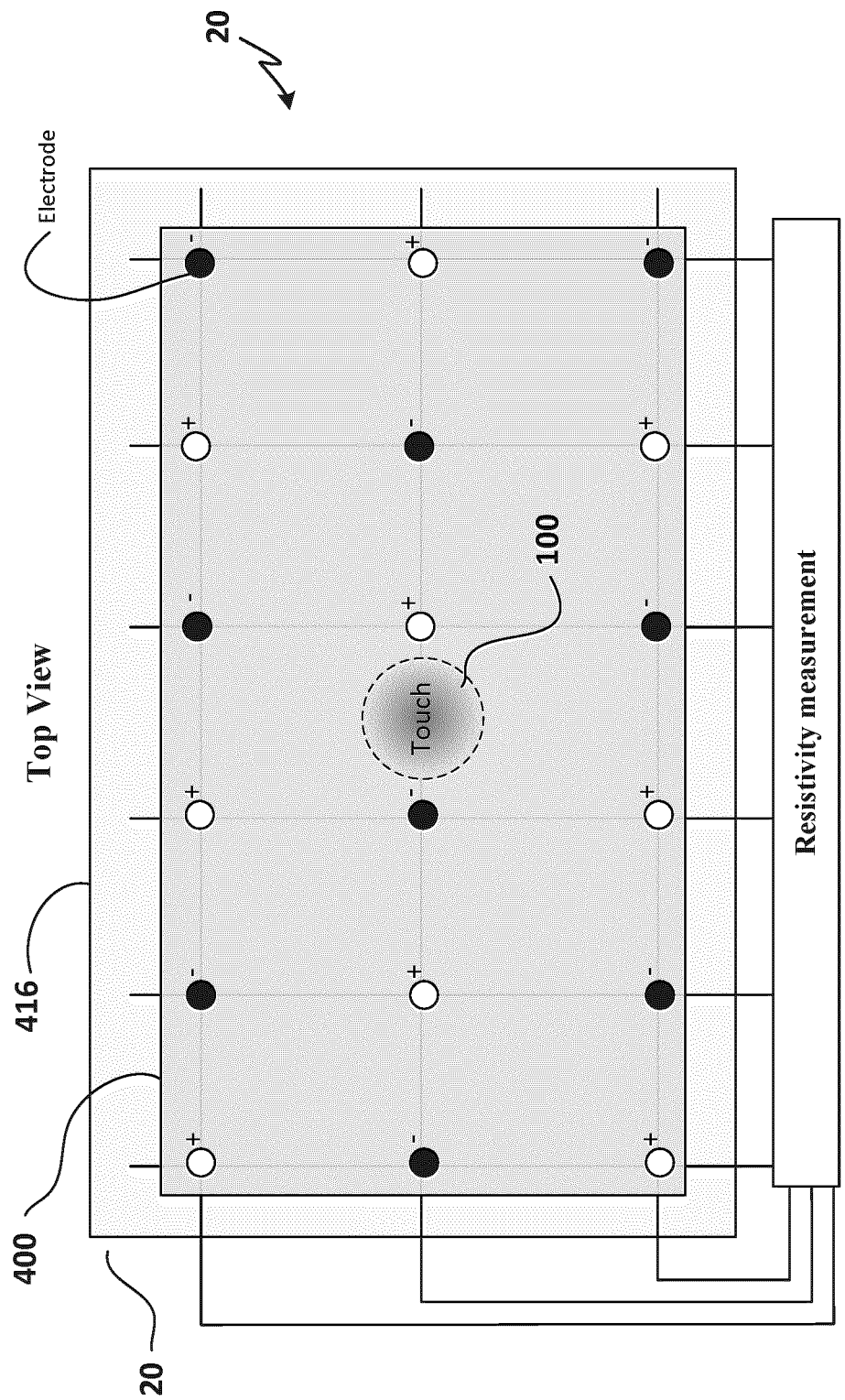
FIG. 13C illustrates an embodiment of a PHAST having an array of electrodes connected to its touch-sensitive element for enabling the detection of a two-dimensional location of a touch.

In some embodiments, more than two electrodes (e.g., one input electrode and one output electrode) may be connected to the touch-sensitive element. In some embodiments, a plurality of electrodes connected to the touch-sensitive element can be arranged in an array which may be used to measure the resistivity of various portions or subsections of the touch-sensitive element. FIG. 13C presents a schematic representation of a top view of a PHAST 20 comprising an array of input (black circles) and output (white circles) electrodes connected to a touch-sensitive element 400 being subject to touch 100. In this embodiment, it will be appreciated that the position of the touch 100 can be determined by probing or comparing resistivity between various pairs of the array of electrodes, where a resistivity between the two electrodes on each side of the touched area may detect a change of resistivity more significant than the if measuring it with the electrode on opposed corners for example, while the change of resistivity may be barely detected when using a pair of electrodes located along the perimeter. Comparing the disparity between changes of resistivity and using the known position of the electrodes used for measuring it can efficiently be used to determine the two-dimensional position of a touch. In some embodiments, similar configurations can allow for the use of larger touch-sensitive elements while still enabling the detection of a two-dimensional position of a touch. This may allow to facilitate production of such phasic taxels and phasic e-skins. It will be appreciated that integration of a plurality of electrodes used simultaneously can increase the number of possible alternative parallel conductive paths which may reduce the sensitivity of the phasic taxel compared to embodiments having only a pair of electrodes connected at each extremity of the touch-sensitive element. In some embodiments, one or more pairs of electrodes can be selected at a given moment to selectively measure a resistivity or change of resistivity between the two selected electrodes which after repeating the process with another pair of electrodes can serve to extrapolate the two-dimensional position of a touch using the known positions of the selected electrodes. In such embodiments, it will be appreciated that, even while selecting only one electrode at a time for example, a change of resistivity can be measured and detected by taking advantage of the high frequency of change of pair of electrodes that can be achieved with an electronic controller. For example, by switching between two pair of electrodes at a high frequency may allow to observe a change of resistivity between each of the pairs occurring over a few milliseconds and evidently an increase of frequency may increase resolution.

Figure 14A:
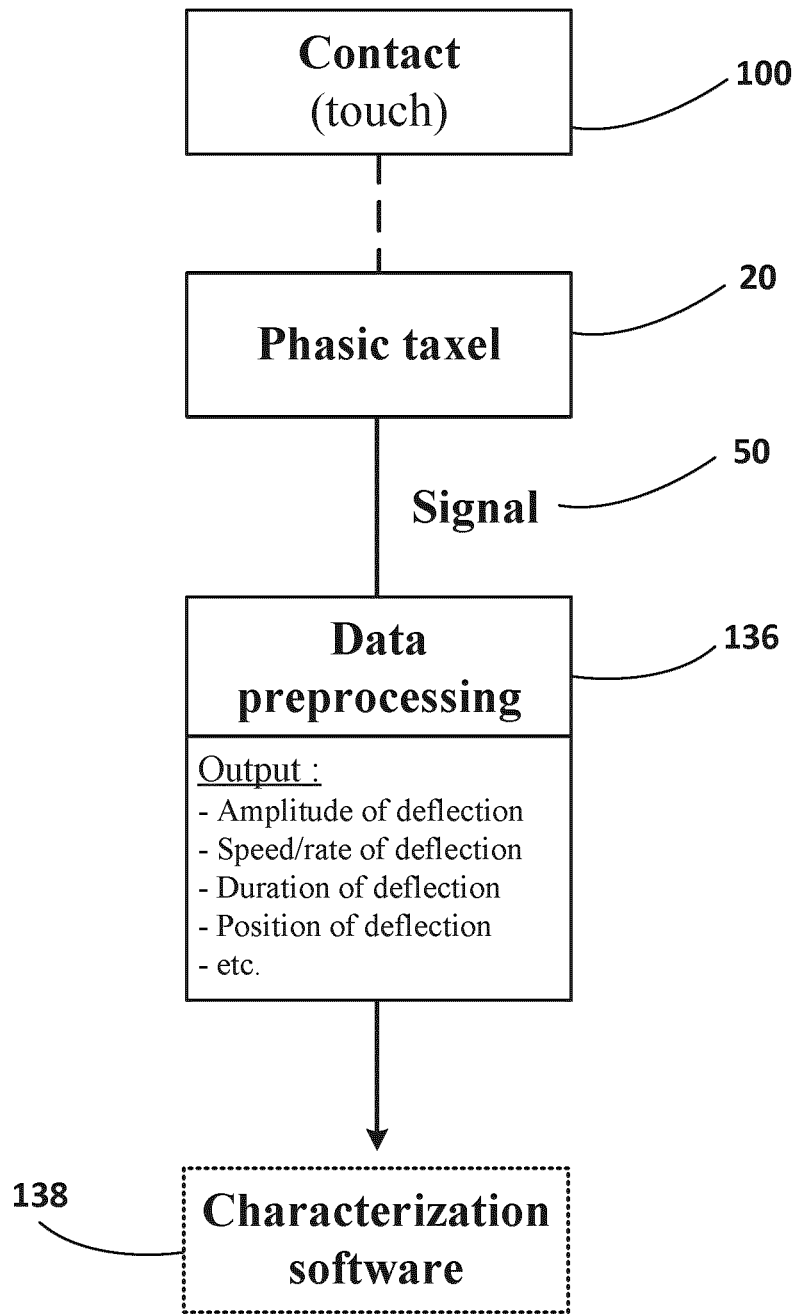
FIG. 14A is a bloc diagram illustrating of a possible embodiment of a device that can allow to detect a phasic tactile event from a signal of a phasic taxel.
Figure 14B:
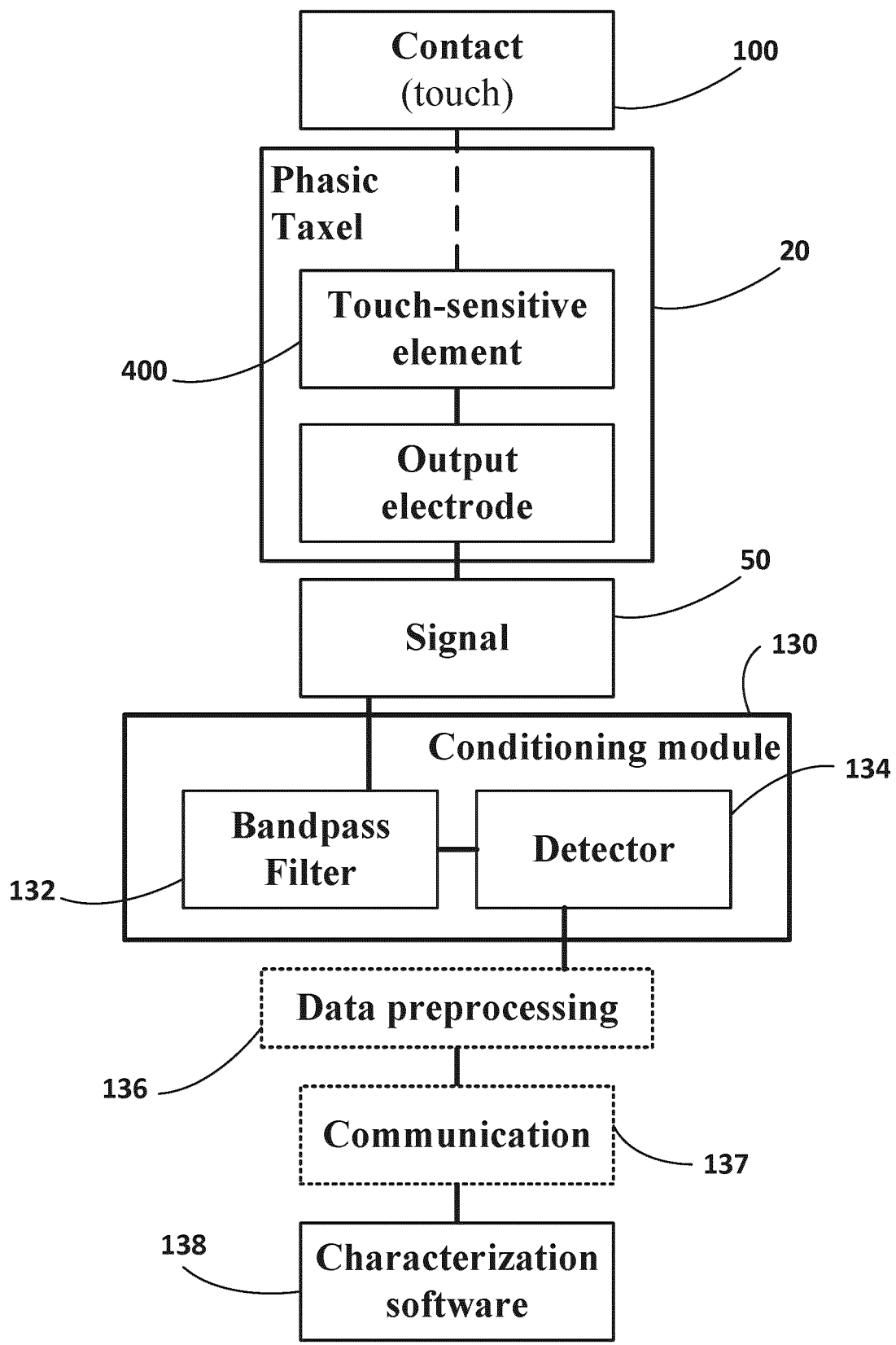
FIG. 14B is a bloc diagram illustrating of another possible embodiment of a device that can allow to detect a phasic tactile event from a signal of a phasic taxel.

In some embodiments, one or more touch-sensitive elements 400 can be directly or indirectly connected to a resistivity measurement circuitry that can allow to detect a phasic change of resistivity and therefore to detect a touch. FIGS. 14A and 14B are block diagrams illustrating possible embodiments of the device or the method that can allow to detect a phasic tactile event from a signal of a phasic taxel. In some embodiments, the signal 50, comprising information associated to a contact or touch 100 on a touch-sensitive element 400 of a phasic taxel 20, namely a change of resistivity or a relative change of resistance for example, and can be transmitted through an output electrode, can be processed with the circuitry of a conditioning module 130 also referred to as a resistivity measurement circuitry. In some embodiments, a circuitry of a conditioning module 130 can include bandpass filter 132 and a detector 134. In some embodiments, once one or more phasic change of resistivity is detected in the signal 50, it can be pre-processed with a data preprocessing module 136 or can be processed with a communication module 137 or can be directly analyzed by a characterization software 138 that can efficiently interpret one or more characteristic of the contact or touch 100 at the origin of the phasic change of resistivity. In some embodiments, the signal or data can be processed by a data processing module 136 and can then be transmitted to a characterization software 138 to be analyzed, where the transmission can be done via a communication module 137 in some embodiments. It will be appreciated that some configuration of the resistivity measurement circuitry can have more than one signal or data source as an input, where the additional signal or data can come from various or an additional touch-sensitive element 400, or an array of touch-sensitive elements, or various or an additional output electrode, or an array of output electrodes, or various or additional or distinct PHAST 20, or an array of PHASTs (e-skin), or a combination thereof. In some embodiments, the at least one additional signal can be connected to the conditioning module 130 or the bandpass filter 132 or the detector 134 or any data preprocessing module 136 or any communication module 137 or the characterization software 138. Therefore, in some embodiments, the characterization software 138 can, in the end, allow for the characterization of a touch using a plurality of signals and data resulting from a touch and can also allow for the characterization of a plurality of touches inducing one or more signals and data.

A bandpass filter or a high-pass filter can be used for filtering interferences with low frequencies that may result from any environmental disruption, any structural change that may be induced from a change of temperature, humidity or pressure and plastic deformation of the touch-sensitive element 400 or any other component of the phasic taxel 20 that may induce low frequency noise in the signal 50. A bandpass filter or a low-pass filter can be used for filtering high frequency electric noise or interference. It will be appreciated that a bandpass filter 132 can be replaced by a combination of a low-pass filter and a high-pass filter. Evidently, additional bandpass filters can be added and used to better filter the signal. Furthermore, various bandpass filters can be used for various PHASTs of a same or a plurality of e-skin and can be further interconnected with one another in the circuit.

A detector 134 of a conditioning module 130 can comprise a circuitry that allows to detect pics of change of resistivity (increase followed by a decrease of resistivity) by various means, which may comprise comparing the resistivity to a reference threshold that can be maximum value, a change of resistivity or others. In some embodiments, a conditioning module 130 can comprise a derivative circuit based on and using at least one operational amplifier.

An optional data preprocessing module 136 can be used to process some aspect of the detected signal or the data associated to a touch event (period of time when a touch is applied or sequence of touches). In some embodiments, the pre-processed signals or data can then be transmitted to a communication module 137. In some embodiments, the pre-processed signals or data can be transmitted to a characterization software 138.

An optional communication module 137 can be used to order and/or classify, namely by determining/characterizing various aspects of the touch (e.g., the amplitude or the speed/rate of the deflection) associated with at least some of the detected and optionally pre-processed data before transmitting it to the characterization software 138. In some embodiments, such a communication module 137 can be required to implement multiple PHASTs within an e-skin configuration, for example.

Figure 15:
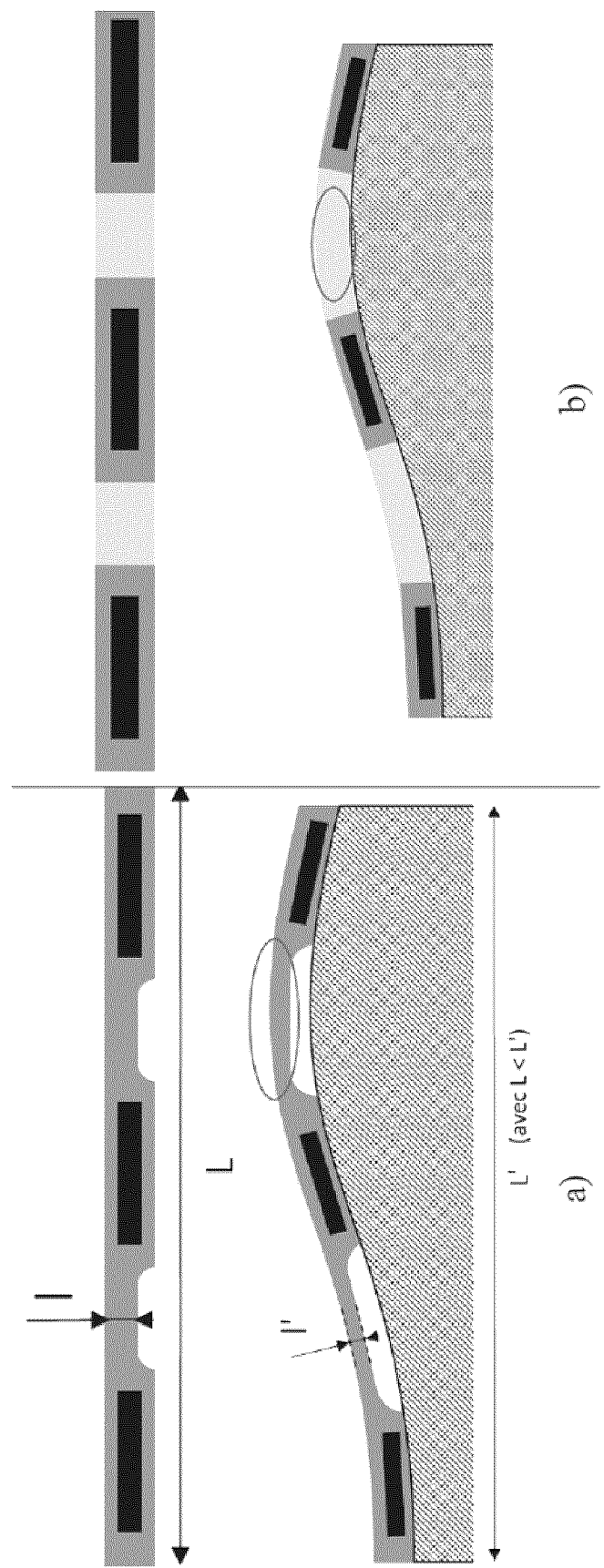
FIG. 15 illustrates cross-sections of various embodiments of e-skin that can be used to be placed or fitted onto various surfaces.

FIG. 15 presents cross-sections of various embodiments of e-skin that can be used to be placed or fitted onto various surfaces. In the embodiments presented the surface is curved and the e-skin comprises various matrices between the PHASTs, where in the embodiment a) the matrix is thinner and in the embodiment b) the matrix is of a more flexible material to allow the e-skin to be curved to take the shape of the surface.

Figure 16A:
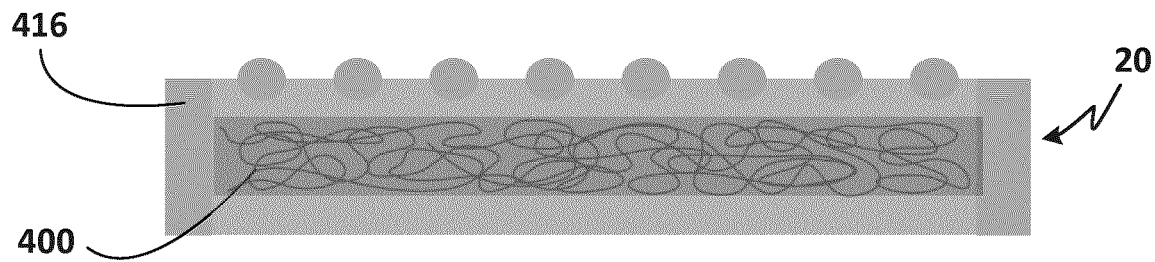
FIG. 16A is a schematic representation of a possible texturing of the upper contact surface of the PHAST.
Figure 16B:
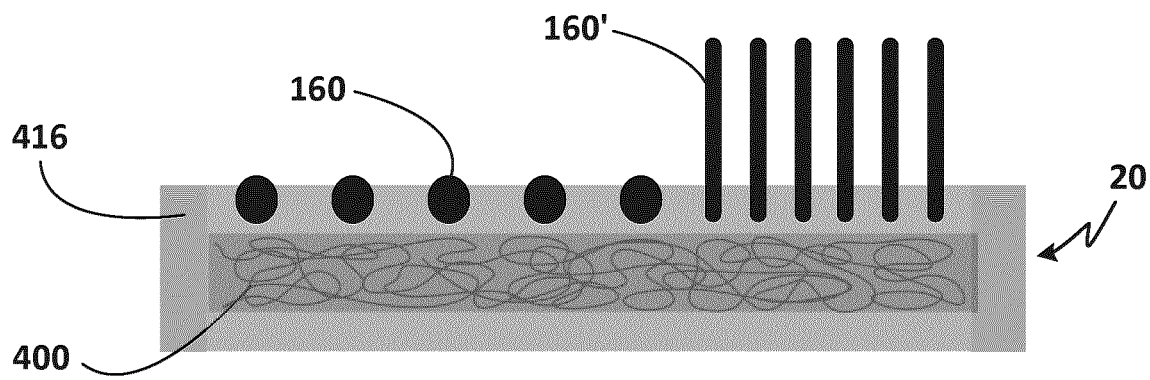
FIG. 16B is a schematic representation of a possible texturing of the upper contact surface of a PHAST by embedding or coupling an alternative material.
Figure 16C:
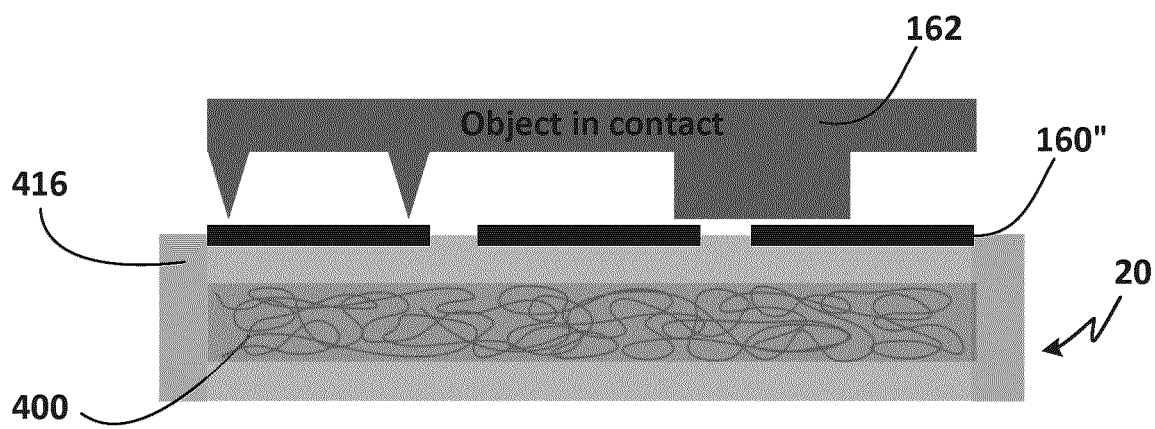
FIG. 16C is a schematic representation of a possible covering of the upper surface of a PHAST with a cover layer.

In some embodiments, the upper surface of a PHAST 20 can be textured. FIGS. 16A, 16B and 16C present a schematic representation of an embodiment having their upper contact surface textured. The exemplary embodiment of FIG. 16A present a textured upper surface of the encapsulation 416 (layer of viscoelastic material covering the touch-sensitive element 400) or of the bottom viscoelastic layer 404 (part of the encapsulation layer 416). In some embodiments, the encapsulation 416 can comprise one or more additional structuring object 160 of an alternative material that can be embedded in or coupled to it, which can be used to texture it or adjust and modify the response of the PHAST to touch. As illustrated in FIG. 16B, a plurality of additional three-dimensional structuring objects 160 and 160' that can be partially embedded in the encapsulation 416 and can be arranged in an array when required. In some embodiments, a structuring object 160 can be simply coupled (not embedded) to the upper surface of the PHAST and/or can be protruding from it. FIG. 16C illustrates an embodiment having two-dimensional structuring objects 160" that are thin plates coupled to the contact surface. An object in contact 162 is illustrated to illustrate that the shape of the structure of the structuring objects 160 can influence the resulting response. In fact, with a touch induced by such an object 162, the response to touch would obviously be different for such a PHAST (embodiment of FIG. 16C) than for PHASTs similar to the previous embodiment (FIG. 16B) due to the shape of the structure of the structuring objects 160. It will be appreciated that the texturing or the structuring objects does not have to be limited to a specific shape or arrangement, which may be changed or adjusted as required by the application for which it is made.

Some embodiments can present a type of soft electronic skin (e-skin) intended for use in human-machine tactile interaction. In some embodiments, this e-skin employs an array of sensing units that can be based on piezoresistive carbon nanotubes films (CNT) embedded in a viscoelastic (elastomeric or elastic and viscous) medium configured to respond to human touch in a manner that resembles the response of fast-adapting afferents in mammalian skin. In some embodiments, a PHAST can be manufactured by embedding multi-wall carbon nanotubes (MWCNT) in a compliant polymer matrix can be soft, miniaturized, printable, and compatible with large-scale production processes.

In an embodiment, an array of 191 PHAST units (e-skin) demonstrated excellent performance (84% twenty participants; 97% single participant) at classifying skin-to-skin person-machine tactile interaction gestures (i.e., social gestures) using an interpreting algorithm.

Applicant have tested some embodiments an e-skin with an experimental protocol consisting of having a group of people doing social gestures using their fingers on various PHAST e-skin. In some experiments, participants were aged from 21 to 67 years old, 40% female and 60% male. The datasets were obtained using a methodology approved by the ethics review committee of the Université de Sherbrooke. The participants were free to apply the gesture at his or her convenience (right or left hand, position and direction of the gesture). Interactions were recorded, segmented and labeled. Thus, different datasets of tactile gestures can be obtained and an accuracy of more than 90% for most of the type of gestures with some embodiments of the interpreting algorithm.

Brief Summary of Piezoresistivity
Standard Gauge Equations

Consider a conductive cylinder of diameter D, or a slab of thickness D, of length L, of section S, of resistivity $\rho$, the resistance R is, $$R = \rho \frac{L}{S} \text{ gives } \frac{\Delta R}{R} \approx \frac{\Delta \rho}{\rho} + \frac{\Delta L}{L} - \frac{\Delta S}{S}$$

Given $\epsilon_a$ and $\epsilon_t$, the axial and transverse Cauchy strains, $\epsilon_a$ and $\epsilon_t$, and $\nu$ the Poisson ratio, the dimensional changes are described by, $$\epsilon_a = \frac{dL}{L}, \epsilon_t = \frac{dD}{D}, \frac{dS}{S} = 2\frac{dD}{D}, \epsilon_t = -\nu \epsilon_a$$

Thus, for small variations, $$\frac{dR}{R}(\epsilon) = \frac{d\rho}{\rho}(\epsilon) + \epsilon_a - 2\epsilon_a = \frac{d\rho}{\rho}(\epsilon) + \epsilon_a(1+2\nu) = \frac{d\rho}{\rho} - \epsilon_t\left(\frac{1}{\nu}+2\right)$$

In standard metal strain gauges, it can be said that in the variation of resistance as a function of the strain, the term can relate to a change in resistivity often dominates over the term related to dimensional changes. For certain materials the Poisson effect can be small (e.g., viz. $\nu \approx 0:2$, in Si monocrystals). For other materials such as polymers (e.g., $\nu \approx 0:5$) so for small variations, $$\frac{dR}{R}(\epsilon) \approx \frac{d\rho}{\rho}(\epsilon) + 2\epsilon_a \approx \frac{d\rho}{\rho}(\epsilon) - 4\epsilon_t$$

How $d\rho/\rho$ varies according to c depends on the choice of material.

Standard piezoresistivity seems unable to explain the behavior of the sensing cell described in the main text since these relationships, even with non-uniform multiaxial strains under indentation, do not lend themselves to reversals in changes of resistance during steady increase or decrease of deflection. It would require the relationship from deflection to strain to be non-monotonic.

Percolation Networks

In percolation networks, which are not continuous media but composites, the resistivity changes are not distinguished from dimensional changes to model the change in resistance of a conducting element. The change in resistance can be modeled in terms of distance changes between junctions owing to the heterogeneity of the medium described by Dawson et al. (DOI: 10.1088/0953-8984/8/43/024).

The basic model based on the work of Zhang et al. (DOI: 10.1002/1099-0488(20001101)38:21<2739::AID-POLB40>3.0.CO; 2-O) begins by writing the average resistance, R, of many junctions of resistance, $R_j$, in series along many paths in parallel, and by neglecting the resistance, $R_c$, from junction to junctions (see reference 114), $$R = \frac{M(R_j + R_c \approx 0)}{N}$$

where M is the number of junctions on a path and N is the number of paths. The tunneling current, J, is a function of an electron's mass and charge, m and e, the potential and the potential barrier across the junction, V and Ø, and s the length of the junction, $$J = \frac{\sqrt[3]{2m\emptyset}}{2s}\left(\frac{2}{h}\right)^2 V \exp\left(-\frac{4\pi s}{h}\sqrt{2m\emptyset}\right)$$

Given the effective cross-sectional area of all junctions, $a^2$, and regrouping some constants as $\gamma=4\pi/\sqrt{2m\emptyset}$, and $\alpha=(8\pi h)/(3a^2 \gamma e^2)$ we have, $$R_j = \frac{V}{a^2 J} = \alpha s e^{\gamma s}, \text{ thus } R = \frac{M}{N}\alpha s e^{\gamma s}$$

It follows that if under strain the length of the junctions change from $s_0$ to s, the relative resistance changes as, $$\frac{R}{R_0} = \frac{s}{s_0}e^{\gamma(s-s_0)}$$

In the case of uniform compressive strain, $\epsilon_a=(s-s_0)/s_0$, and $\epsilon_a=-2\epsilon_t$. Assuming that the junctions lengthen according to strain, $$\frac{R}{R_0} = (1-\epsilon)e^{\gamma s_0 \epsilon_a} \approx e^{\gamma s_0 \epsilon_a}, \text{ or } k = \frac{R-R_0}{R_0} = e^{\gamma s_0 \epsilon_a} - 1 = e^{-2\gamma s_0 \epsilon_t} - 1$$

The relative variation decreases progressively slower as a function of uniform compressive strain which was empirically observed in composites loaded with the conductive particles (see references 34 and 35). In the sensor cell described in the main text strain is like a Hertz-contact problem in the initial stages. As indentation increases, stress becomes locally very large at the apex of the indenter.

What is claimed is:

1. A touch-sensitive device comprising:
   at least one loosely connected three-dimensional network of conductive particles encapsulated between a bottom viscoelastic layer and a top viscoelastic layer, wherein at least a portion of said at least one loosely connected three-dimensional network of conductive particles is free from viscoelastic material;
   a portion of said at least one loosely connected three-dimensional network having an initial local resistivity, a second local resistivity higher than said initial local resistivity when said portion of said at least one loosely connected three-dimensional network undergoes a local stretch, and a third local resistivity lower than said second local resistivity when said portion of said at least one loosely connected three-dimensional network undergoes a local compression;
   said second local resistivity resulting from decreased connection between local conductive particles of said portion of said at least one loosely connected three-dimensional network being brought apart from one another during said local stretch; and
   said third local resistivity resulting from increased connection between said local conductive particles being brought closer to one another during said local compression;
   wherein said local stretch resulting from a partial deflection of said at least one loosely connected three-dimensional network resulting from a partial compression of said touch-sensitive device;
   wherein said local compression resulting from a further deflection of said at least one loosely connected three-dimensional network resulting from a further compression of said touch-sensitive device;
   wherein a local resistivity of said portion of said at least one loosely connected three-dimensional network undergoes both an increase and a decrease during each of contact establishment and contact release of said touch-sensitive device having a phasic response to contact; and
   wherein a rate of at least one of said increase and said decrease of said local resistivity as a function of time depends on a rate of deflection and/or a magnitude of deflection of said contact.

2. The touch-sensitive device as defined in claim 1, wherein said rate of both said increase and said decrease of said local resistivity as a function of time depends on said rate of deflection of said contact.

3. The touch-sensitive device as defined in claim 1, wherein an amplitude of a change of said local resistivity as a function of time depends on said magnitude of deflection.

4. The touch-sensitive device as defined in claim 1, wherein both said increase and said decrease of said local resistivity as a function of time depends on said rate of deflection and/or said magnitude of deflection.

5. The touch-sensitive device as defined in claim 1, wherein said rate of deflection and/or said magnitude of deflection depends on a type of touch of said contact.

6. The touch-sensitive device as defined in claim 1, further comprising a resistivity detection circuitry at least connected to at least one output electrode to detect said increase and said decrease of said local resistivity of said portion of said at least one loosely connected three-dimensional network.

7. The touch-sensitive device as defined in claim 1, wherein said conductive particles are one of: elongated conductive particles, carbon nanotubes, and a film of loosely interconnected carbon nanotubes.

8. The touch-sensitive device as defined in claim 1, wherein a plurality of said loosely connected three-dimensional network is arranged in a plurality of arrays, wherein each one of said plurality of said arrays are electrically isolated from one another and stacked on top of each other.

9. The touch-sensitive device as defined in claim 8, wherein a plurality of said rate of at least one of said increase and said decrease of said local resistivity as a function of time from said plurality of loosely connected three-dimensional network is used for classifying or characterizing a mechanical contact or a gesture.

10. The touch-sensitive device as defined in claim 1, wherein said at least one loosely connected three-dimensional network is a two-dimensional array comprising a plurality of strips parallel to one another;
wherein a plurality of said two-dimensional arrays are electrically isolated from one another and parallelly stacked on top of each other;
wherein said plurality of said strips parallel to one another of a first one of said plurality of said two-dimensional arrays have a first direction different from a second direction of said plurality of said strips parallel to one another of said at least one other of said plurality of said two-dimensional arrays; and
wherein at least one signal of said first one of said plurality of said two-dimensional arrays and at least one signal of said second one of said plurality of said two-dimensional arrays responds to a two-dimensional position of said contact.

11. The touch-sensitive device as defined in claim 10, wherein said first direction is about perpendicular to said second direction.

12. The touch-sensitive device as defined in claim 1, wherein at least a portion of a bottom surface of said bottom viscoelastic layer is coupled to an upper surface of a flat support layer or of a textured support layer, wherein said support layer being more rigid than said bottom viscoelastic layer.

13. The touch-sensitive device as defined in claim 1, wherein a portion of said bottom or top viscoelastic layer is textured.

14. The touch-sensitive device as defined in claim 1, wherein said touch-sensitive device comprises a plurality of input electrodes and a plurality of output electrodes arranged in an array of electrodes and connected to said at least one loosely connected three-dimensional network.

15. A method of manufacturing the touch-sensitive device defined in claim 1, the method comprising:
preparing a conductive particle solution by mixing said conductive particles in a fluid;
applying at least one layer of said conductive particle solution on a surface of a viscoelastic support layer; and
drying said layer of said conductive particle solution to remove said fluid and leave a loosely connected three-dimensional network of conductive particles respecting a selected dispersion between said conductive particles; and
covering said loosely connected three-dimensional network of said conductive particles with a viscoelastic encapsulating layer, wherein said covering comprises leaving at least a portion of said loosely connected three-dimensional network of said conductive particles free from viscoelastic material.

16. The method as defined in claim 15, wherein said preparing said conductive particle solution further comprises mixing a surfactant in said conductive particle solution.

17. The method as defined in claim 15, wherein said applying comprising spraying or printing said conductive particle solution on said surface of said bottom viscoelastic layer to make said layer of said conductive particle solution.

18. A method for detecting contact comprising:
providing a touch-sensitive device as defined in claim 1;
subjecting said touch-sensitive device to said contact;
measuring said local resistivity of said portion of said at least one loosely connected three-dimensional network;
detecting an increase and/or a decrease of said local resistivity as a function of time of said portion of said at least one loosely connected three-dimensional network; and
characterizing a rate of deflection and/or a magnitude of deflection of said contact using a rate of said increase and/or said decrease of said local resistivity as a function of time of said portion.

19. The method as defined in claim 18, wherein said characterizing further comprises identifying any establishing of said contact, any releasing of said contact, or said magnitude of deflection using said at least one of said increase and/or said decrease of said local resistivity as a function of time.

20. The method as defined in claim 18, wherein said characterizing further comprises determining said rate of deflection of said contact with an amplitude of said increase and/or said decrease of said local resistivity as a function of said magnitude of said deflection of said touch-sensitive device induced by said contact.

* * * * *